United States Patent
Shirahama et al.

(10) Patent No.: US 9,647,677 B2
(45) Date of Patent: May 9, 2017

(54) INTEGRATOR, AD CONVERTER, AND RADIATION DETECTION DEVICE

(71) Applicant: Kabushiki Kaisha Toshiba, Minato-ku (JP)

(72) Inventors: Hirokatsu Shirahama, Yokohama (JP); Shunsuke Kimura, Kawasaki (JP); Tetsuro Itakura, Nerima (JP); Masanori Furuta, Odawara (JP); Hideyuki Funaki, Shinagawa (JP); Go Kawata, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/138,667

(22) Filed: Apr. 26, 2016

(65) Prior Publication Data

US 2017/0005667 A1    Jan. 5, 2017

(30) Foreign Application Priority Data

Jun. 30, 2015  (JP) .................. 2015-131045

(51) Int. Cl.
  *G01T 1/10*  (2006.01)
  *H03M 1/34*  (2006.01)
  *G01T 1/20*  (2006.01)

(52) U.S. Cl.
  CPC ............. *H03M 1/34* (2013.01); *G01T 1/20* (2013.01)

(58) Field of Classification Search
  CPC ....... G01J 5/24; G01J 1/42; G01J 1/44; H01L 25/00; H04N 5/33
  See application file for complete search history.

(56) References Cited

U.S. PATENT DOCUMENTS

| | | | |
|---|---|---|---|
| 6,188,069 B1 * | 2/2001 | Endoh ................. | G01J 5/20 250/332 |
| 6,977,601 B1 * | 12/2005 | Fletcher .............. | H03M 3/32 341/143 |

(Continued)

FOREIGN PATENT DOCUMENTS

| JP | 2001-257593 | 9/2001 |
|---|---|---|
| JP | 2015-228578 | 12/2015 |

OTHER PUBLICATIONS

A. Nascetti et al. "High Dynamic Range Current-to-Digital Readout Electronics for Lab-on-Chip Applications", IEEE 4th International Workshop on Advances in Sensors and Interfaces, 2011, 5 pages.

(Continued)

*Primary Examiner* — Kiho Kim
(74) *Attorney, Agent, or Firm* — Oblon, McClelland, Maier & Neustadt, L.L.P.

(57) ABSTRACT

An integrator according to an embodiment includes first and second nodes, first to fifth switches, first and second main integration capacitors, and a first subsidiary integration capacitor. The first (second, third, fourth, fifth) switch has one end connected to a first (third, first, fourth, first) node and the other end connected to a third (second, fourth, second, fifth) node. The first main integration capacitor has one end connected to the third node and the other end connected to a standard voltage line. The second main integration capacitor has one end connected to the fourth node and the other end connected to the standard voltage line. The first subsidiary integration capacitor that has one end connected to the fifth node and the other end connected to the standard voltage line.

17 Claims, 15 Drawing Sheets

(56) References Cited

U.S. PATENT DOCUMENTS

| | | | | |
|---|---|---|---|---|
| 7,477,175 B1* | 1/2009 | Tkachev | ............... | H03M 3/372 |
| | | | | 341/143 |
| 8,054,141 B2* | 11/2011 | Saw | ..................... | H03K 3/0231 |
| | | | | 331/111 |
| 9,184,623 B1* | 11/2015 | Cical | ...................... | H03K 17/56 |
| 2001/0050366 A1* | 12/2001 | Okuyama | ................ | H04N 5/33 |
| | | | | 257/72 |
| 2006/0279339 A1* | 12/2006 | Rebholz- | | |
| | | Goldmann | ............ | H03K 17/164 |
| | | | | 327/108 |
| 2008/0251721 A1* | 10/2008 | Ueno | ........................ | G01J 5/08 |
| | | | | 250/332 |
| 2010/0001173 A1* | 1/2010 | Hanson | ................... | G01W 1/08 |
| | | | | 250/214 A |
| 2014/0347029 A1* | 11/2014 | Daub | .................... | H02M 3/156 |
| | | | | 323/282 |
| 2014/0368367 A1* | 12/2014 | Choi | ..................... | H03M 3/372 |
| | | | | 341/143 |
| 2015/0349753 A1 | 12/2015 | Itakura et al. | | |

OTHER PUBLICATIONS

A. Dragone et al. "eLine10k: A High Dynamic Range Front-End ASIC for LCLS Detectors", 2012 IEEE Nuclear Science Symposium and Medical Imaging Conference Record (NSS/MIC), 2012, 8 pages.

* cited by examiner

INTEGRATOR, AD CONVERTER, AND RADIATION DETECTION DEVICE

CROSS REFERENCE TO RELATED APPLICATIONS

This application is based upon and claims the benefit of priority from the prior Japanese Patent Application No. 2015-131045, filed on Jun. 30, 2015, the entire contents of which are incorporated herein by reference.

FIELD

Embodiments described herein relate generally to an integrator, an AD converter, and a radiation detection device.

BACKGROUND

In the related art, an AD converter of a charge integration type that integrates a current by an integrator and executes AD conversion on an integral value is known. The AD converter is used for a radiation detector in which a signal is output as a current.

As the AD converter according to the related art, an AD converter in which an integrator is configured by an operational amplifier is suggested. In the AD converter, a current is input to an integration capacitor by a virtual ground of the operational amplifier and a charge according to the input current is accumulated in the integration capacitor. In addition, a voltage of the integration capacitor is output as an integral value.

Because the integrator according to the related art cannot integrate a current during resetting of the integration capacitor, integration precision is low. In addition, because the integrator includes the operational amplifier, power consumption is large.

DETAILED DESCRIPTION

Embodiments will now be explained with reference to the accompanying drawings. The present invention is not limited to the embodiments.

An integrator according to an embodiment includes a first node, a second node, a first switch, a second switch, a first main integration capacitor, a third switch, a fourth switch, a second main integration capacitor, a fifth switch, and a first subsidiary integration capacitor. The first node receives a signal current. The second node outputs a voltage. The first switch has one end connected to the first node and the other end connected to a third node. The second switch has one end connected to the third node and the other end connected to the second node. The first main integration capacitor has one end connected to the third node and the other end connected to a standard voltage line. The third switch has one end connected to the first node and the other end connected to a fourth node. The fourth switch has one end connected to the fourth node and the other end connected to the second node. The second main integration capacitor has one end connected to the fourth node and the other end connected to the standard voltage line. The fifth switch has one end connected to the first node and the other end connected to a fifth node. The first subsidiary integration capacitor has one end connected to the fifth node and the other end connected to the standard voltage line.

Figure 1:
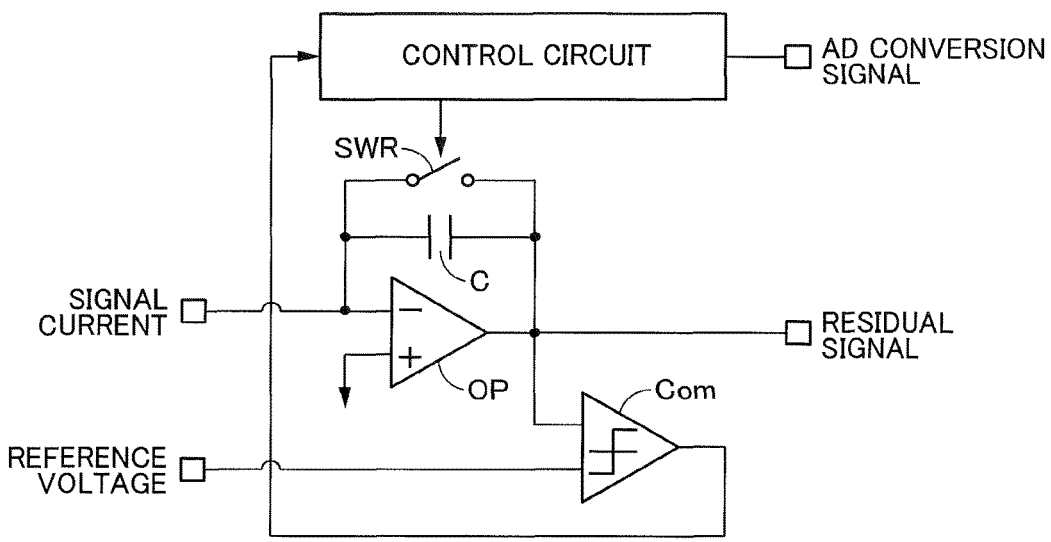
FIG. 1 is a diagram illustrating an example of an AD converter according to the related art.

First, an AD converter of a charge integration type according to the related art will be described with reference to FIGS. 1 to 3. FIG. 1 is a diagram illustrating an example of the AD converter according to the related art. As illustrated in FIG. 1, the AD converter includes an operational amplifier OP, an integration capacitor C, a reset switch SWR, a comparator Com, and a control circuit.

In the operational amplifier OP, a non-inversion input terminal is grounded and a signal current is input from an inversion input terminal. The operational amplifier OP configures an integrator with the integration capacitor C.

The integration capacitor C has one end connected to the inversion input terminal of the operational amplifier OP and the other end connected to an output terminal of the operational amplifier OP. A signal current is input to the integration capacitor C by a virtual ground of the operational amplifier OP and a charge according to the signal current is accumulated in the integration capacitor C. A voltage of the other end of the integration capacitor C becomes an output voltage of the integrator.

The reset switch SWR has one end connected to the inversion input terminal of the operational amplifier OP and the other end connected to the output terminal of the operational amplifier OP. If the reset switch SWR is turned on, the integration capacitor C is reset. Opening and closing of the reset switch SWR are controlled by the control circuit.

The comparator Com receives an output voltage of the integrator and a reference voltage Vref. The comparator Com compares the output voltage of the integrator and the reference voltage Vref having been received and outputs a comparison result.

The control circuit receives the comparison result from the comparator Com and outputs an AD conversion signal showing an AD conversion value of an integral value of a signal current, according to the received comparison result. In addition, the control circuit outputs a control signal to control the reset switch SWR, according to the comparison result received from the comparator Com.

Figure 2:
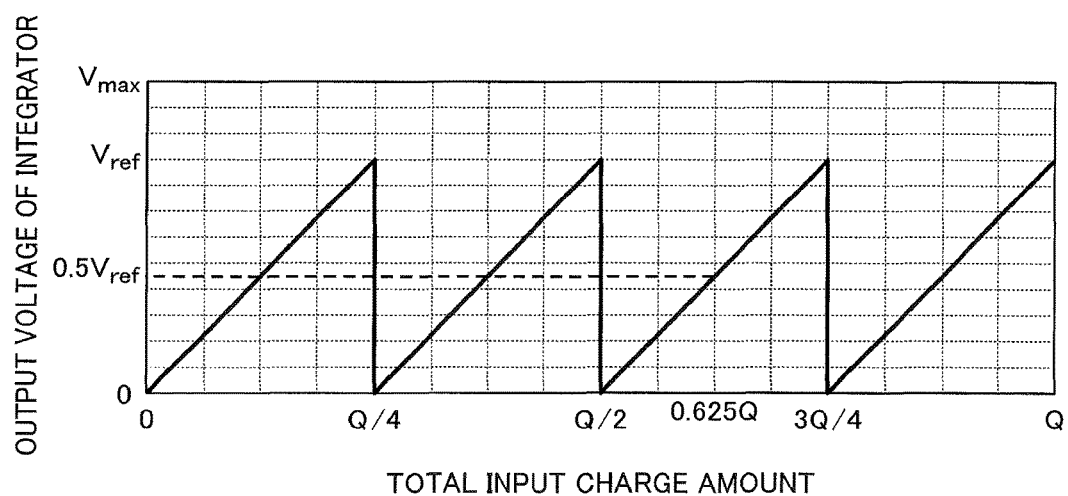
FIG. 2 is a diagram illustrating an output voltage of an integrator in the AD converter of FIG. 1.

FIG. 2 is a diagram illustrating a relation of the output voltage (voltage of the other end of the integration capacitor C) of the integrator in the AD converter of FIG. 1 and a total input charge to the integration capacitor C by a signal current. As illustrated in FIG. 2, the integration capacitor C is reset whenever a voltage becomes higher than the reference voltage Vref. In an example of FIG. 2, if a charge of Q/4 is accumulated in the integration capacitor C, the integration capacitor C is reset.

The AD converter of FIG. 1 outputs an AD conversion signal according to the number of times of resetting of the integration capacitor C and outputs an output voltage of the integrator at the time of integration completion as a residual signal. For example, when the total input charge by the signal current is 0.625Q, the integration capacitor C is reset two times and a charge of 0.125Q is accumulated at the time of the integration completion. Therefore, the AD converter of FIG. 1 outputs an AD conversion signal according to two times and outputs 0.5 Vref as a residual signal.

In the case in which the integration capacitor C is reset when the voltage of the integration capacitor C becomes the reference voltage Vref, the AD converter can integrate the signal current accurately. However, in actuality, the integration capacitor C is reset after a predetermined time passes from when the voltage becomes the reference voltage Vref. The predetermined time includes a delay time of the comparator Com and a time until the control circuit outputs a control signal according to the comparison result received from the comparator Com.

For this reason, in the AD converter of FIG. 1, the integration capacitor C may be reset in a state in which a signal current input in the predetermined time is not reflected in an integral value. In addition, the signal current input during resetting of the integration capacitor C is not integrated with the integration capacitor C and is not reflected in the integral value, similar to the above case.

As such, because the AD converter of FIG. 1 cannot integrate a part of the signal current, integration precision is low. For this reason, the signal current cannot be converted with high precision, in the AD converter of FIG. 1.

Figure 3:
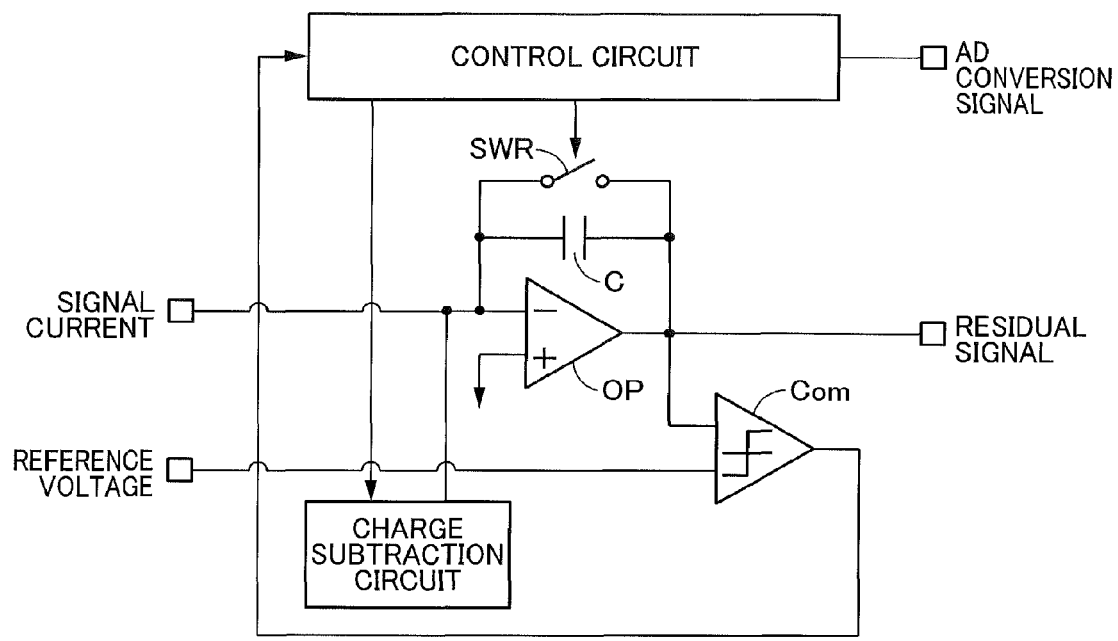
FIG. 3 is a diagram illustrating another example of the AD converter according to the related art.

As an AD converter to resolve such a problem, an AD converter illustrated in FIG. 3 is suggested. FIG. 3 is a diagram illustrating another example of the AD converter according to the related art. As illustrated in FIG. 3, the AD converter is obtained by adding a charge subtraction circuit to the AD converter of FIG. 1.

The charge subtraction circuit is a circuit to extract a predetermined charge from the integration capacitor C and is controlled by the control circuit. In the AD converter of FIG. 3, if the output voltage of the integrator becomes higher than the reference voltage Vref, the control circuit outputs a control signal and the charge subtraction circuit extracts the predetermined charge from the integration capacitor C. When the charge subtraction circuit extracts the charge of Q/4 from the integration capacitor C every time, the output voltage of the integrator changes, similar to FIG. 2.

In the AD converter of FIG. 3, because the integration capacitor C is reset after completion of the integration, an integration error caused by resetting of the integration capacitor C does not occur. For this reason, the AD converter of FIG. 3 can integrate a signal current with high precision.

However, in the AD converter, when the charge subtraction circuit extracts the charge, ringing occurs in an output voltage of an integration circuit and the comparator Com executes an erroneous operation. In the AD converter of FIG. 3, a high-speed operational amplifier OP with a phase margin is necessary to suppress the erroneous operation of the comparator Com from occurring. For this reason, the AD converter of FIG. 3 has large power consumption.

Hereinafter, embodiments of the present invention will be described with reference to the drawings.

First Embodiment

Figure 4:
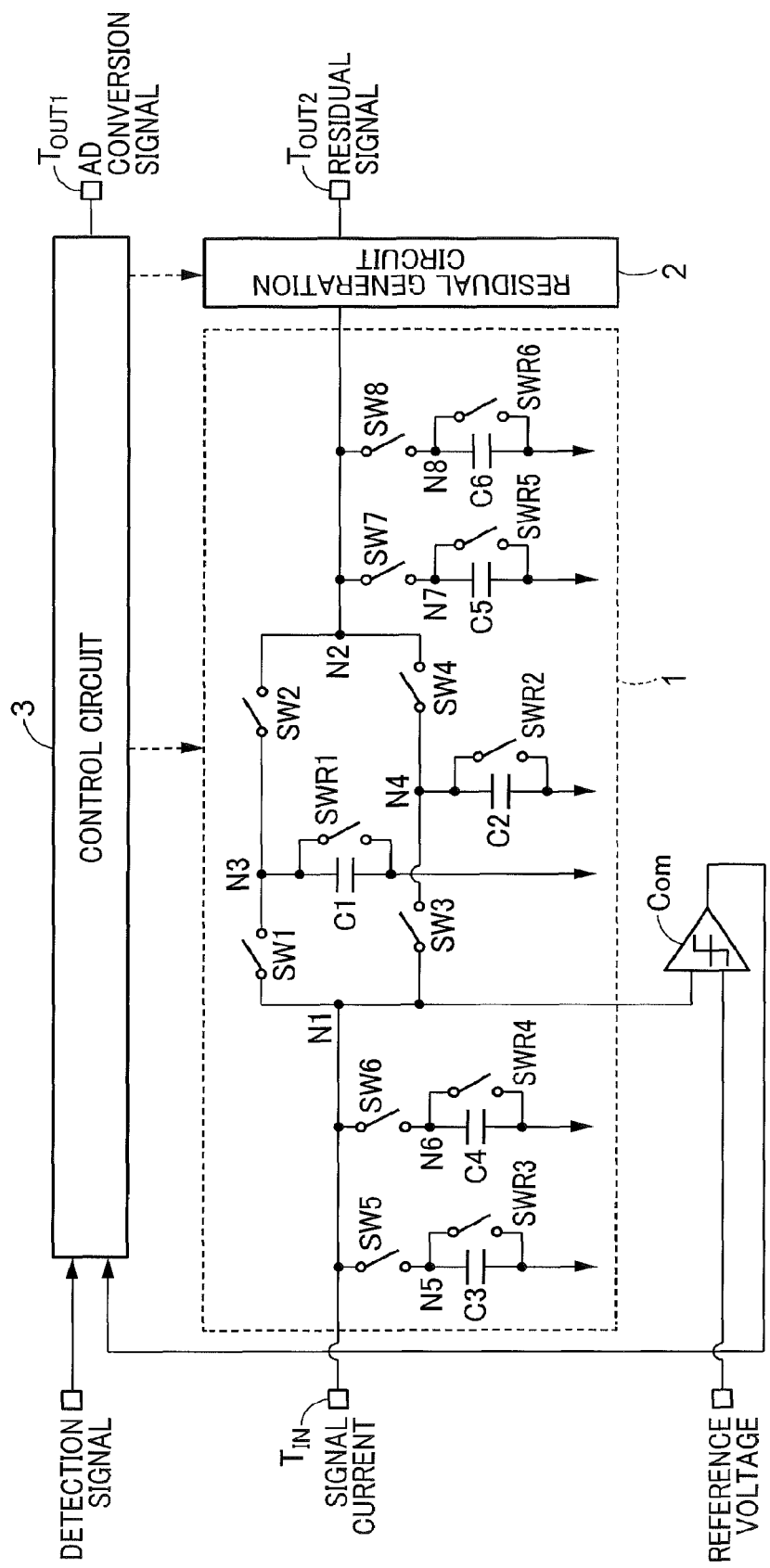
FIG. 4 is a diagram illustrating an example of an AD converter according to a first embodiment.

An AD converter according to a first embodiment will be described with reference to FIGS. 4 to 7. FIG. 4 is a diagram illustrating an example of the AD converter according to this embodiment. As illustrated in FIG. 4, the AD converter includes an input terminal $T_{IN}$, output terminals $T_{OUT1}$ and $T_{OUT2}$, an integrator 1, a residual generation circuit 2, a comparator Com, and a control circuit 3.

The input terminal $T_{IN}$ is an input terminal of the AD converter. The AD converter receives a signal current to be an AD conversion target, from the input terminal $T_{IN}$.

The output terminal $T_{OUT1}$ is one output terminal of the AD converter. The AD converter outputs an AD conversion signal from the output terminal $TOUT_1$. The AD conversion signal is a digital signal showing an AD conversion value of an integral value of the signal current.

The output terminal $T_{OUT2}$ is the other output terminal of the AD converter. The AD converter outputs a residual signal from the output terminal $T_{OUT2}$. The residual signal is an analog signal showing a residual (quantization error) after AD conversion is executed on the integral value of the signal current.

The integrator 1 is connected to the input terminal $T_{IN}$, the comparator Com, and the residual generation circuit 2. A connection point of the input terminal $T_{IN}$ and the comparator Com in the integrator 1 is called a node N1. The node N1 (first node) is an input node corresponding to the input terminal of the integrator 1. The integrator 1 receives the signal current from the node N1.

In addition, a connection point with the residual generation circuit 2 in the integrator 1 is called a node N2. The node N2 (second node) is an output node corresponding to the output terminal of the integrator 1. A voltage of the node N2 is input to the residual generation circuit 2.

As illustrated in FIG. 4, the integrator 1 includes switches SW1 to SW8, capacitors C1 to C6, and reset switches SWR1 to SWR6. Opening and closing of the switches SW1 to SW8 and the reset switches SWR1 to SWR6 are controlled by the control circuit 3.

The switch SW1 (first switch) has one end connected to the node N1 and the other end connected to a node N3. In this embodiment, the node N1 is a connection point of the switches SW1, SW3, SW5, and SW6. In addition, the node N3 (third node) is a connection point of the switches SW1 and SW2, the capacitor C1, and the reset switch SWR1.

The switch SW2 (second switch) has one end connected to the node N3 and the other end connected to the node N2. In this embodiment, the node N2 is a connection point of the switches SW2 and SW4.

The capacitor C1 (first main integration capacitor) has one end connected to the node N3 and the other end connected to the standard voltage line. A capacity value of the capacitor C1 is C1. The capacitor C1 is a main integration capacitor to integrate an odd-number-th signal current input to the integrator 1. The main integration capacitor is an integration capacitor used for integration of the signal current, without depending on the magnitude of the signal current.

If the odd-number-th signal current is input to the integrator 1, the switch SW1 is turned on and the switch SW2 is turned off. As a result, the signal current is input to the capacitor C1, a charge according to the signal current is accumulated in the capacitor C1, and a voltage (voltage of the node N3) of the capacitor C1 becomes a voltage according to the signal current. Because the switch SW1 is turned on during the integration, the voltage of the capacitor C1 becomes the voltage of the node N1 and is input to the comparator Com.

Meanwhile, if an even-number-th signal current is input to the integrator 2, the switch SW1 is turned off and the switch SW2 is turned on. For this reason, the voltage of the capacitor C1 becomes the voltage of the node 2 and is input to the residual generation circuit 2.

The standard voltage line is a ground line, for example. However, the standard voltage line is not limited thereto. The standard voltage line may be a positive or negative power-supply voltage line and may be a wiring line connected to a constant voltage source.

The reset switch SWR1 (first reset switch) has one end connected to the node N3 and the other end connected to the standard voltage line. If the reset switch SWR1 is turned on, the capacitor C1 is reset.

The switch SW3 (third switch) has one end connected to the node N1 and the other end connected to a node N4. In this embodiment, the node N4 (fourth node) is a connection point of the switches SW3 and SW4, the capacitor C2, and the reset switch SWR2.

The switch SW4 (fourth switch) has one end connected to the node N4 and the other end connected to the node N2.

The capacitor C2 (second main integration capacitor) has one end connected to the node N4 and the other end connected to the standard voltage line. A capacity value of the capacitor C2 is C2. The capacitor C2 is a main integration capacitor to integrate an even-number-th signal current input to the integrator 1.

If the even-number-th signal current is input to the integrator 1, the switch SW3 is turned on and the switch SW4 is turned off. As a result, the signal current is input to the capacitor C2, a charge according to the signal current is accumulated in the capacitor C2, and a voltage (voltage of the node N4) of the capacitor C2 becomes a voltage according to the signal current. Because the switch SW3 is turned on during the integration, the voltage of the capacitor C2 becomes the voltage of the node N1 and is input to the comparator Com.

Meanwhile, if an odd-number-th signal current is input to the integrator 2, the switch SW3 is turned off and the switch SW4 is turned on. For this reason, the voltage of the capacitor C2 becomes the voltage of the node N2 and is input to the residual generation circuit 2.

The even-number-th and the odd-number-th are determined conveniently. In this embodiment, because the capacitors C1 and C2 may alternately execute the integration of the signal currents, the even number and the odd number of the number of times of inputting the signal currents integrated by the capacitors C1 and C2 may be reversed.

The reset switch SWR2 (second reset switch) has one end connected to the node N4 and the other end connected to the standard voltage line. If the reset switch SWR2 is turned on, the capacitor C2 is reset.

The switch SW5 (fifth switch) has one end connected to the node N1 and the other end connected to a node N5. In this embodiment, the node N5 (fifth node) is a connection point of the switch SW5, the capacitor C3, and the reset switch SWR3.

The capacitor C3 (first subsidiary integration capacitor) has one end connected to the node N5 and the other end connected to the standard voltage line. A capacity value of the capacitor C3 is C3. The capacitor C3 is a first subsidiary integration capacitor integrating the signal current with the main integration capacitor, when the voltage (voltage of the main integration capacitor) of the node N1 exceeds a reference voltage first.

If the voltage of the node N1 exceeds the reference voltage first, the switch SW5 is turned on. As a result, the signal current is input to the capacitor C3 and the capacitor C3 is added as an integration capacitor of the integrator 1. Then, the signal current is integrated by the main integration capacitor and the capacitor C3.

The reset switch SWR3 (third reset switch) has one end connected to the node N5 and the other end connected to the standard voltage line. If the reset switch SWR3 is turned on, the capacitor C3 is reset.

The switch SW6 (sixth switch) has one end connected to the node N1 and the other end connected to a node N6. In this embodiment, the node N6 (sixth node) is a connection point of the switch SW6, the capacitor C4, and the reset switch SWR4.

The capacitor C4 (second subsidiary integration capacitor) has one end connected to the node N6 and the other end connected to the standard voltage line. A capacity value of the capacitor C4 is C4. The capacitor C4 is a second subsidiary integration capacitor integrating the signal current with the main integration capacitor, when the voltage (voltage of the main integration capacitor) of the node N1 exceeds the reference voltage second.

If the voltage of the node N1 exceeds the reference voltage second, the switch SW6 is turned on. As a result, the signal current is input to the capacitor C4 and the capacitor C4 is added as an integration capacitor of the integrator 1. Then, the signal current is integrated by the main integration capacitor and the capacitors C3 and C4.

The reset switch SWR4 (fourth reset switch) has one end connected to the node N6 and the other end connected to the standard voltage line. If the reset switch SWR4 is turned on, the capacitor C4 is reset.

In an example of FIG. 4, the integrator 1 includes the two subsidiary integration capacitors. However, one subsidiary integration capacitor may be included or three or more subsidiary integration capacitors may be included. Even in any case, a switch is connected between the subsidiary integration capacitor and the node N1 and a reset switch is connected in parallel.

The switch SW7 (seventh switch) has one end connected to the node N2 and the other end connected to a node N7. In this embodiment, the node N7 (seventh node) is a connection point of the switch SW7, the capacitor C5, and the reset switch SWR5.

The reset switch SWR5 (fifth reset switch) has one end connected to the node N7 and the other end connected to the standard voltage line. If the reset switch SWR5 is turned on, the capacitor C5 is reset.

The capacitor C5 (first averaging capacitor) has one end connected to the node N7 and the other end connected to the standard voltage line. A capacity value of the capacitor C5 is C5. The capacitor C5 is an averaging capacitor to average the voltage of the node N2.

As described above, during inputting of a certain signal current, the voltage of the node N2 becomes the voltage of the main integration capacitor having integrated a signal current input immediately before inputting the certain signal current. However, the voltage of the main integration capacitor is not proportional to a total integral value of the signal current. This is because the integrator 1 integrates the signal current while adding the subsidiary integration capacitor as the integration capacitor.

It is difficult to generate a residual signal, on the basis of the voltage of the main integration capacitor. Therefore, first, it is necessary to change, that is, average the voltage of the main integration capacitor to be proportional to the total integral value of the signal current. The averaging capacitor is a capacitor that extracts the predetermined charge from the main integration capacitor and averages the voltage of the main integration capacitor.

When the voltage of the main integration capacitor at the time of integrating the signal current input immediately before inputting the certain signal current never exceeds the reference voltage, the capacitor C5 is used for averaging of the voltage of the main integration capacitor. The residual generation circuit 2 generates a residual signal, on the basis of the averaged voltage of the node N2.

The switch SW8 (eighth switch) has one end connected to the node N2 and the other end connected to a node N8. In this embodiment, the node N8 (eighth node) is a connection point of the switch SW8, the capacitor C6, and the reset switch SWR6.

The reset switch SWR6 (sixth reset switch) has one end connected to the node N8 and the other end connected to the standard voltage line. If the reset switch SWR8 is turned on, the capacitor C6 is reset.

The capacitor C6 (second averaging capacitor) has one end connected to the node N8 and the other end connected to the standard voltage line. A capacity value of the capacitor C6 is C6. The capacitor C6 is an averaging capacitor to average the voltage of the node N2.

When the number of times of the voltage of the main integration capacitor at the time of integrating the signal current input immediately before inputting the certain signal current, exceeding the reference voltage, is equal to or smaller than 1, the capacitor C6 is used for averaging of the voltage of the main integration capacitor. The residual generation circuit 2 generates a residual signal, on the basis of the averaged voltage of the node N2.

Figure 5:
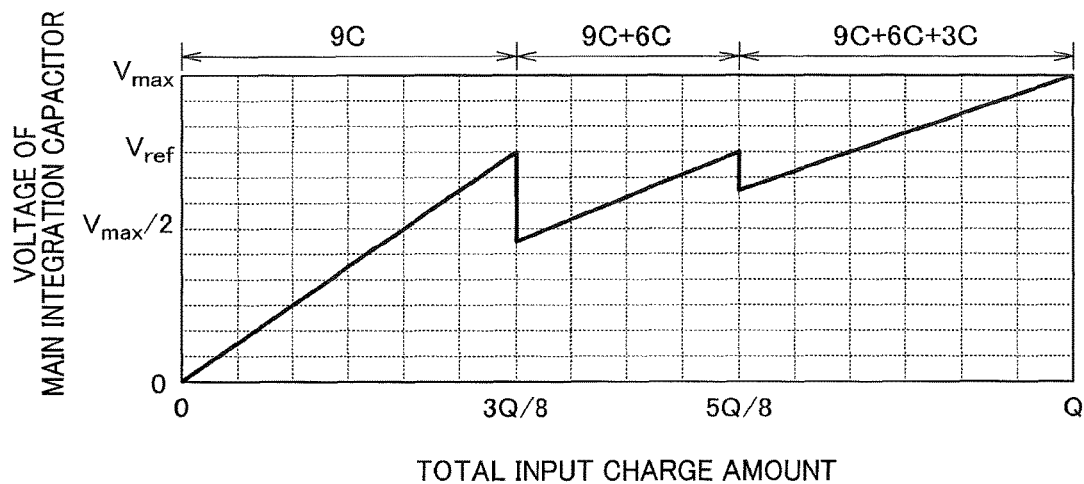
FIG. 5 is a graph illustrating a relation of a voltage of a main integration capacitor at the time of integrating a signal current and a total input charge amount.

Here, the voltage of the main integration capacitor (capacitor C1 or C2) at the time of integrating the signal current will be described with reference to FIG. 5. FIG. 5 is a graph illustrating a relation of the voltage of the main integration capacitor and the total input charge amount. The total input charge amount corresponds to a total integral value of the signal current.

In FIG. 5, 0 is a standard voltage, Vmax is a maximum voltage, Vref (=Vmax×3/4) is a reference voltage, and Q is a maximum charge amount integrated by the integrator 1. In addition, C1=C2=9C(F), C3=6C(F), and C4=3C(F) are satisfied. C(F) is any capacity value. In FIG. 5, a 1.5-bit AD converter is assumed. Hereinafter, the case in which the main integration capacitor is the capacitor C1 will be described as an example.

If the odd-number-th signal current is input, the signal current is integrated by only the capacitor C1, until the voltage of the capacitor C1 exceeds Vref. At this time, a total capacity value of the integration capacitors of the integrator 1 is 9C. Therefore, in the example of FIG. 5, when the total input charge amount is 0 to 3Q/8, the voltage of the capacitor C1 increases monotonously from 0 to Vref.

If the total input charge amount exceeds 3/Q8 and the voltage of the capacitor C1 exceeds Vref first, the capacitor C3 is added as the integration capacitor of the integrator 1. As a result, a total capacity value of the integration capacitors of the integrator 1 becomes 15C(=9C+6C). If the capacitor C3 is added, the charge 3Q/8 accumulated in the capacitor C1 is distributed to the capacitors C1 and C3 instantly. For this reason, the voltage of the capacitor C1 decreases to Vref×3/5.

Then, the signal current is integrated by the capacitors C1 and C3. Therefore, when the total input charge amount is larger than 3Q/8 and is equal to or smaller than 5Q/8, the voltage of the capacitor C1 increases monotonously from Vref×3/5 to Vref.

If the total input charge amount exceeds 5/Q8 and the voltage of the capacitor C1 exceeds Vref second, the capacitor C4 is added as the integration capacitor of the integrator 1. As a result, a total capacity value of the integration capacitors of the integrator 1 becomes 18C(=9C+6C+3C). If the capacitor C4 is added, the charge 5Q/8 accumulated in the capacitors C1 and C3 is distributed to the capacitors C1, C3, and C4 instantly. For this reason, the voltage of the capacitor C1 decreases to Vref×5/6.

Then, the signal current is integrated by the capacitors C1, C3, and C4. Therefore, when the total input charge amount is larger than 5Q/8 and is equal to or smaller than Q, the voltage of the capacitor C1 increases monotonously from Vref×5/6 to Vmax.

As known from FIG. 5, the voltage of the main integration capacitor at the time of integrating the signal current is not proportional to the total integral value (total input charge amount) of the signal current. For this reason, when the residual signal is generated, the voltage of the main integration capacitor is averaged by the averaging capacitor.

Figure 6:
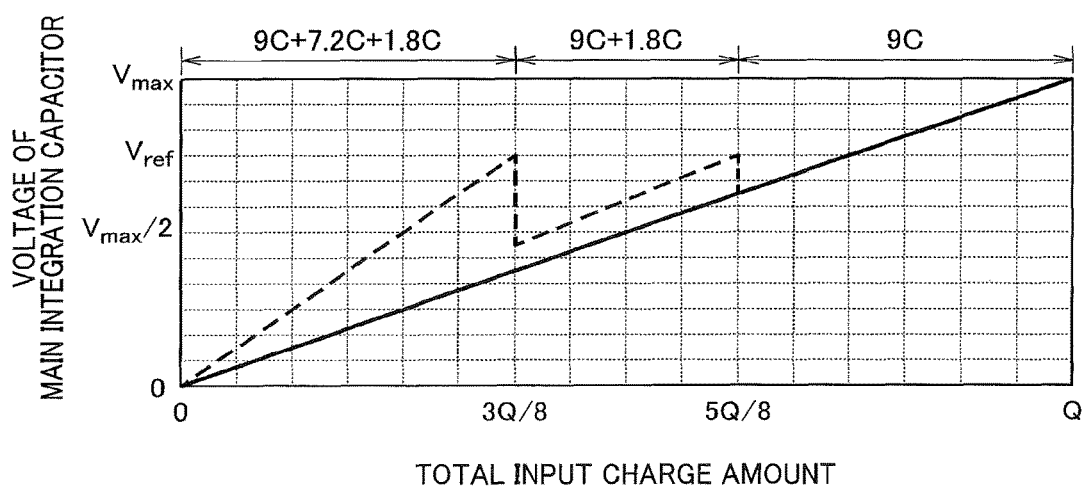
FIG. 6 is a graph illustrating a relation of a voltage of a main integration capacitor at the time of generating a residual signal and a total input charge amount.

Here, the voltage of the main integration capacitor (capacitor C1 or C2) at the time of generating the residual signal will be described with reference to FIG. 6. FIG. 6 is a graph illustrating a relation of the voltage of the main integration capacitor at the time of generating the residual signal and the total input charge amount.

In FIG. 6, a broken line shows a voltage of the main integration capacitor before the averaging and a solid line shows a voltage of the main integration capacitor after the averaging. In addition, C1=C2=9C(F), C5=7.2C(F), and C6=1.8C(F) are satisfied. The other values are the same as the values in FIG. 5. Hereinafter, the case in which the main integration capacitor is the capacitor C1 will be described as an example.

If the even-number-th signal current is input after the odd-number-th signal current is integrated, the switch SW1 is turned off, the switch SW2 is turned on, and the voltage of the capacitor C1 becomes the voltage of the node N2 and is averaged.

At the time of integration, when the voltage of the capacitor C1 never exceeds the reference voltage, that is, the total input charge amount is equal to or smaller than 3Q/8, the switches SW7 and SW8 are turned on and the reset switches SWR5 and SWR6 are turned off. As a result, the capacitors C5 and C6 are connected to the capacitor C1 and the charge accumulated in the capacitor C1 is distributed to the capacitors C1, C5, and C6 instantly. Because a capacity value changes from 9C to 18C(=9C+7.2C+1.8C) by connection of the capacitors C5 and C6, the voltage of the capacitor C1 after the averaging becomes ½ (=9/18) of the original voltage, as illustrated in FIG. 6.

At the time of integration, when the voltage of the capacitor C1 exceeds the reference voltage once, that is, the total input charge amount is larger than 3Q/8 and equal to or smaller than 5Q/8, the switch SW8 and the reset switch SWR5 are turned on and the switch SW7 and the reset switch SWR6 are turned off. As a result, the capacitor C6 is connected to the capacitor C1 and the charge accumulated in the capacitor C1 is distributed to the capacitors C1 and C6 instantly. Because a capacity value changes from 9C to 10.8C(=9C+1.8C) by connection of the capacitor C6, the voltage of the capacitor C1 after the averaging becomes 5/6 (=9/10.8) of the original voltage, as illustrated in FIG. 6.

At the time of integration, when the voltage of the capacitor C1 exceeds the reference voltage two times, that is, the total input charge amount is larger than 5Q/8, the switches SW7 and SW8 are turned off and the reset switches SWR5 and SWR6 are turned on. That is, the voltage of the capacitor C1 is maintained at the original voltage.

By executing the averaging as described above, the voltage of the capacitor C1 can be changed to be proportional to the total input charge amount, as illustrated in FIG. 6. When C5=9C and C6=1.8C are set and the number of times of the voltage of the capacitor C1 exceeding the reference voltage is 0, the voltage can be averaged by only the capacitor C5 and when the number of times is 1, the voltage can be averaged by only the capacitor C6.

The residual generation circuit 2 is connected to the integrator 1 and the output terminal $T_{OUT2}$. The node N2 corresponds to the input terminal of the residual generation circuit 2. In addition, the output terminal $T_{OUT2}$ corresponds to the output terminal of the residual generation circuit 2. The residual generation circuit 2 generates a residual signal, on the basis of the voltage of the node N2 after the averaging. The residual generation circuit 2 outputs the generated residual signal from the output terminal $T_{OUT2}$. A method of generating the residual signal by the residual generation circuit 2 will be described in detail later.

The comparator Com has one input terminal connected to the node N1 of the integrator N1 and the other input terminal connected to a reference voltage source (not illustrated in the drawings). The comparator Com receives the voltage of the node N1 from one input terminal and receives the reference voltage from the other input terminal. The comparator Com compares the voltage of the node N1 and the reference voltage and inputs a comparison result to the control circuit 3. Hereinafter, it is assumed that the comparator Com outputs L (Low) when the voltage of the node N1 is equal to or lower than the reference voltage and outputs H (High) when the voltage of the node N1 exceeds the reference voltage. In addition, L and H may be reversed.

The control circuit 3 receives the comparison result from the comparator Com and generates an AD conversion signal showing an AD conversion value of the integral value of the signal current, according to the received comparison result. The generated AD conversion signal is output from the output terminal $T_{OUT1}$. The control circuit 3 outputs an AD conversion signal according to the number of times of the voltage of the node N1 exceeding the reference voltage.

In addition, the control circuit 3 outputs a control signal according to the comparison result received from the comparator Com and controls operations of the integrator 1 and the residual generation circuit 2. Specifically, the control circuit 3 controls opening and closing of the switches SW1 to SW8 and the reset switches SWR1 to SWR6 by the control signal.

As illustrated in FIG. 4, the control circuit receives a detection signal. The detection signal is a signal showing that the input of the signal current has been detected. The detection signal is input from a signal current detection circuit provided outside the AD converter, for example. If the detection signal is input, the control circuit 3 starts control of the integrator 1 and the residual generation circuit 2.

Here, an operation of the AD converter will be described with reference to FIGS. 7 and 8. Hereinafter, each of an integration operation and an averaging operation by the integrator 1 will be described.

First, the integration operation by the integrator 1 will be described. FIG. 7 is a timing chart illustrating the integration operation by the integrator 1. In FIG. 7, a first detection signal corresponds to an odd-number-th input signal current 1 and a second detection signal corresponds to an even-number-th input signal current 2.

In addition, it is assumed that the switches SW2 and SW3 and the reset switch SWR1 are turned on and the switches SW1 and SW4 and the reset switches SWR2, SWR3, and SWR4 are turned off, until the first detection signal is input. The switches SW5 and SW6 may be turned on or turned off.

If the signal current 1 is input to the AD converter, a detection signal (first detection signal of FIG. 7) is input to the control circuit 3 and the control circuit 3 causes the integrator 1 to start the integration operation of the signal current 1.

Specifically, the control circuit 3 turns on the switch SW1 and turns off the switch SW2 and the reset switch SWR1. As a result, the capacitor C1 is connected to the node N1 and starts integration of the signal current 1. The voltage of the capacitor C1 is input to one input terminal of the comparator Conn. When the integration starts, the voltage of the capacitor C1 is 0. For this reason, the comparator Com outputs L.

In addition, the control circuit 3 turns on the switch SW4 and turns off the switch SW3. At this time, the reset switch SWR2 maintains an OFF state. As a result, the capacitor C2 is connected to the node N2. During the integration of the signal current 1 by the capacitor C1, the voltage of the capacitor C2 is averaged. In addition, the residual generation circuit 2 generates a residual signal, on the basis of the averaged voltage of the capacitor C2. The averaging and the residual generation will be described later.

In addition, the control circuit 3 turns on the reset switches SWR3 and SWR4 and turns off the switches SW5 and SW6. As a result, the capacitors C3 and C4 are reset. The switches SW5 and SW6 are preferably turned off at a point of time earlier than a point of time when the reset switches SWR3 and SWR4 are turned on.

Then, if the voltage of the capacitor C1 increases and exceeds the reference voltage first, the comparator Com outputs H. If the control circuit 3 receives first H from the comparator Com, the control circuit 3 stores received first H, turns on the switch SW5, and turns off the reset switch SWR3. The reset switch SWR3 is preferably turned off at a point of time earlier than a point of time when the switch SW5 is turned on.

If the switch SW5 is turned on, the charge accumulated in the capacitor C1 is distributed to the capacitors C1 and C3 instantly and the voltage of the capacitor C1 decreases. For this reason, the comparator Com outputs L again. Then, the signal current 1 is integrated by the capacitors C1 and C3.

Then, if the voltage of the capacitor C1 increases again and exceeds the reference voltage second, the comparator Com outputs H again. If the control circuit 3 receives second H from the comparator Com, the control circuit 3 stores received second H, turns on the switch SW6, and turns off the reset switch SWR4. The reset switch SWR4 is preferably turned off at a point of time earlier than a point of time when the switch SW6 is turned on.

If the switch SW6 is turned on, the charge accumulated in the capacitors C1 and C3 is distributed to the capacitors C1, C3, and C4 instantly and the voltage of the capacitor C1 decreases again. For this reason, the comparator Com outputs L again. Then, the signal current 1 is integrated by the capacitors C1, C3, and C4.

In the example of FIG. 4, the integrator includes only the two subsidiary integration capacitors. For this reason, even though the voltage of the capacitor C1 exceeds the reference voltage third, integration by the capacitors C1, C3, and C4 is continuously executed. Then, the integrator 1 continuously executes the integration of the signal current 1, until the next signal current 2 is input or until a predetermined time passes from when the integration of the signal current 1 starts.

If the signal current 2 is input to the AD converter, a detection signal (second detection signal of FIG. 7) is input to the control circuit 3. The control circuit 3 outputs an AD conversion signal, on the basis of the number of H received from the comparator Com during the integration of the signal current 1. In addition, the control circuit 3 causes the integrator 1 to start an integration operation of the signal current 2.

Specifically, the control circuit 3 turns on the switch SW3 and turns off the switch SW4 and the reset switch SWR2. As a result, the capacitor C2 is connected to the node N1 and starts the integration of the signal current 2. The voltage of the capacitor C2 is input to one input terminal of the comparator Com. When the integration starts, the voltage of the capacitor C2 is 0. For this reason, the comparator Com outputs L.

In addition, the control circuit 3 turns on the switch SW2 and turns off the switch SW1. At this time, the reset switch SWR1 maintains an OFF state. As a result, the capacitor C1 is connected to the node N2. During the integration of the signal current 2 by the capacitor C2, the voltage of the capacitor C1 is averaged. In addition, the residual generation circuit 2 generates a residual signal of the signal current 1, on the basis of the averaged voltage of the capacitor C1. The averaging and the residual generation will be described later.

In addition, the control circuit 3 turns on the reset switches SWR3 and SWR4 and turns off the switches SW5 and SW6. As a result, the capacitors C3 and C4 are reset. The switches SW5 and SW6 are preferably turned off at a point of time earlier than a point of time when the reset switches SWR3 and SWR4 are turned on.

Then, if the voltage of the capacitor C2 increases and exceeds the reference voltage first, the comparator Com outputs H. If the control circuit 3 receives first H from the comparator Com, the control circuit 3 stores received first H, turns on the switch SW5, and turns off the reset switch SWR3. The reset switch SWR3 is preferably turned off at a point of time earlier than a point of time when the switch SW5 is turned on.

If the switch SW5 is turned on, the charge accumulated in the capacitor C2 is distributed to the capacitors C2 and C3 instantly and the voltage of the capacitor C2 decreases. For this reason, the comparator Com outputs L again. Then, the signal current 2 is integrated by the capacitors C2 and C3.

Then, if the voltage of the capacitor C2 increases again and exceeds the reference voltage second, the comparator Com outputs H again. If the control circuit 3 receives second H from the comparator Com, the control circuit 3 stores received second H, turns on the switch SW6, and turns off the reset switch SWR4. The reset switch SWR4 is preferably turned off at a point of time earlier than a point of time when the switch SW6 is turned on.

If the switch SW6 is turned on, the charge accumulated in the capacitors C2 and C3 is distributed to the capacitors C2, C3, and C4 instantly and the voltage of the capacitor C2 decreases again. For this reason, the comparator Com outputs L again. Then, the signal current 2 is integrated by the capacitors C2, C3, and C4.

In the example of FIG. 4, the integrator includes only the two subsidiary integration capacitors. For this reason, even though the voltage of the capacitor C2 exceeds the reference voltage third, integration by the capacitors C2, C3, and C4 is continuously executed. Then, the integrator 2 continuously executes the integration of the signal current 2, until a next signal current is input.

Next, the averaging operation by the integrator 1 will be described. FIG. 8 is a timing chart illustrating the averaging operation by the integrator 1.

If the signal current 1 is input to the AD converter, the detection signal is input to the control circuit 3 and the control circuit 3 causes the integrator 1 to start an averaging operation of a signal current 0 input before inputting the signal current 1. The signal current 0 is integrated by the capacitor C2.

Figure 8:
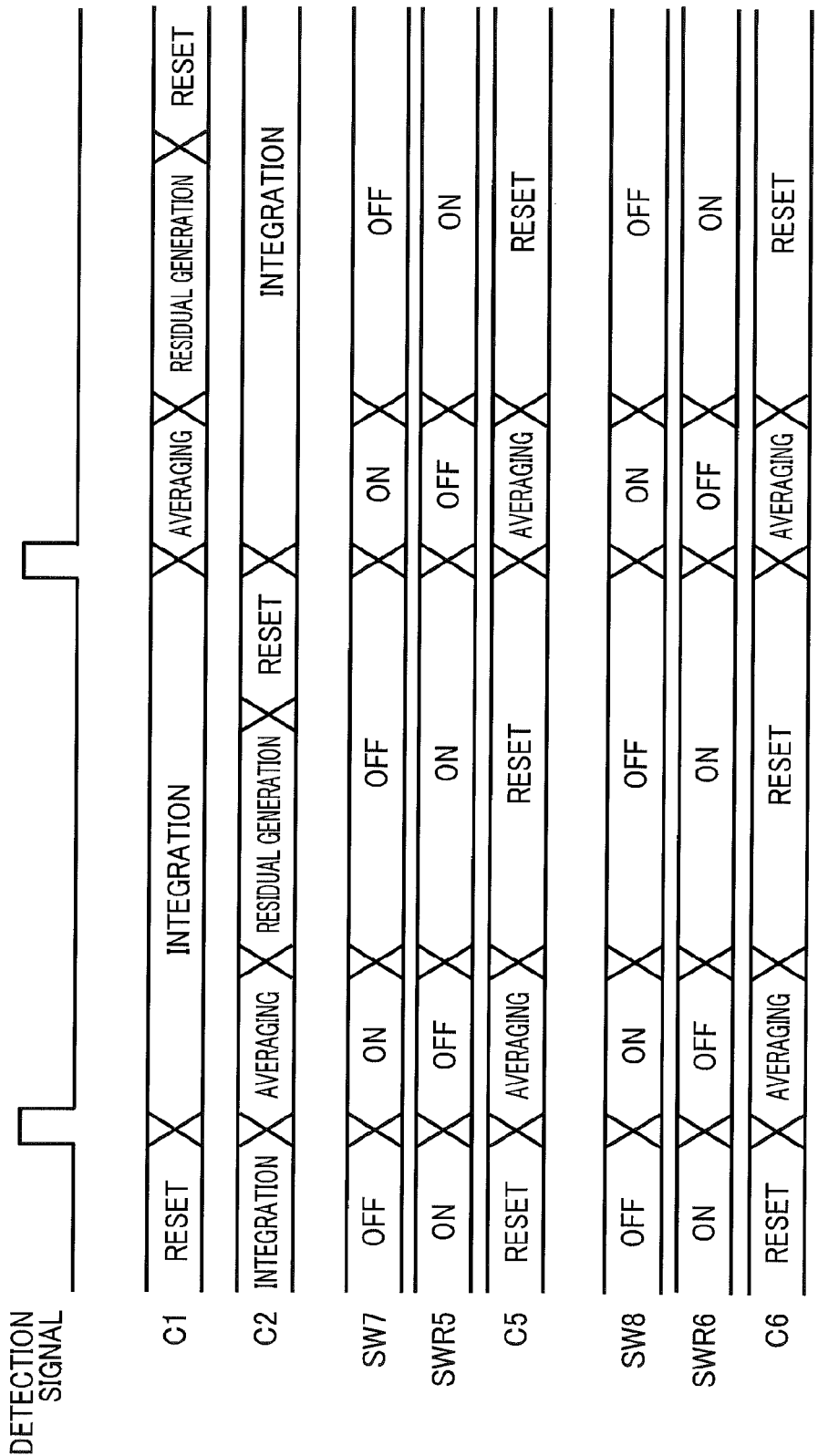
FIG. 8 is a timing chart illustrating an operation of the integrator of FIG. 4.

At the time of integrating the signal current 0, when the voltage of the capacitor C2 never exceeds the reference voltage, as illustrated in FIG. 8, the control circuit 3 turns on the switches SW7 and SW8 and turns off the reset switches SWR5 and SWR6. As a result, the charge accumulated in the capacitor C2 is distributed to the capacitors C2, C5, and C6 and the voltage of the capacitor C2 is averaged. The reset switches SWR5 and SWR6 are preferably turned off at a point of time earlier than a point of time when the switches SWR7 and SWR8 are turned on.

At the time of integrating the signal current 0, when the voltage of the capacitor C2 exceeds the reference voltage once, the control circuit 3 turns on the switch SW8 and turns off the reset switch SWR6. At this time, the switch SW7 maintains an OFF state and the reset switch SWR5 maintains an ON state. As a result, the charge accumulated in the capacitor C2 is distributed to the capacitors C2 and C6 and the voltage of the capacitor C2 is averaged.

At the time of integrating the signal current 0, when the voltage of the capacitor C2 exceeds the reference voltage two times, the switches SW7 and SW8 maintain an OFF state and the reset switches SWR5 and SWR6 maintain an ON state. That is, the voltage of the capacitor C2 does not change.

If a predetermined time passes after the averaging operation starts, the control circuit 3 turns off the switches SW7 and SW8 and turns on the reset switches SWR5 and SWR6. As a result, the capacitors C5 and C6 are reset.

Then, the residual generation circuit 2 generates a residual signal of the signal current 0, on the basis of the averaged voltage of the capacitor C2. The generation of the residual signal will be described in detail later.

Figure 7:
FIG. 7 is a timing chart illustrating an operation of an integrator of FIG. 4.

After the predetermined time passes from the start of the generation of the residual signal, as illustrated in FIG. 7, the control circuit 3 turns on the reset switch SWR2. As a result, the capacitor C2 is reset.

If the signal current 2 is input to the AD converter, the detection signal is input to the control circuit 3 and the control circuit 3 causes the integrator 1 to start an averaging operation of the signal current 1. The signal current 1 is integrated by the capacitor C1.

At the time of integrating the signal current 1, when the voltage of the capacitor C1 never exceeds the reference voltage, as illustrated in FIG. 8, the control circuit 3 turns on the switches SW7 and SW8 and turns off the reset switches SWR5 and SWR6. As a result, the charge accumulated in the capacitor C1 is distributed to the capacitors C2, C5, and C6 and the voltage of the capacitor C2 is averaged. The reset switches SWR5 and SWR6 are preferably turned off at a point of time earlier than a point of time when the switches SWR7 and SWR8 are turned on.

At the time of integrating the signal current 1, when the voltage of the capacitor C1 exceeds the reference voltage once, the control circuit 3 turns on the switch SW8 and turns off the reset switch SWR6. At this time, the switch SW7 maintains an OFF state and the reset switch SWR5 maintains an ON state. As a result, the charge accumulated in the capacitor C1 is distributed to the capacitors C1 and C6 and the voltage of the capacitor C1 is averaged.

At the time of integrating the signal current 1, when the voltage of the capacitor C1 exceeds the reference voltage two times, the switches SW7 and SW8 maintain an OFF state and the reset switches SWR5 and SWR6 maintain an ON state. That is, the voltage of the capacitor C1 does not change.

If a predetermined time passes after the averaging operation starts, the control circuit 3 turns off the switches SW7 and SW8 and turns on the reset switches SWR5 and SWR6. As a result, the capacitors C5 and C6 are reset.

Then, the residual generation circuit 2 generates a residual signal of the signal current 1, on the basis of the averaged voltage of the capacitor C1. The generation of the residual signal will be described in detail later.

After the predetermined time passes from the start of the generation of the residual signal, as illustrated in FIG. 7, the control circuit 3 turns on the reset switch SWR1. As a result, the capacitor C1 is reset.

As described above, the integrator 1 adds the subsidiary integration capacitor, whenever the voltage of the main integration capacitor exceeds the reference voltage, while integrating the signal current by one main integration capacitor at all times. The control circuit 3 generates an AD conversion signal, on the basis of the number of times of the voltage of the main integration capacitor exceeding the reference voltage. The residual generation circuit 2 generates a residual signal of the signal current input immediately before inputting the certain signal current, on the basis of the voltage of the other main integration capacitor. By the above operation, the AD converter according to this embodiment can execute AD conversion on the integral value of the signal current.

As described above, the main integration capacitor of the integrator 1 is not reset and integrates the signal current at all times, during the integration of the signal current. For this reason, in the integrator 1, there is not a problem in that the signal current input during resetting cannot be integrated. In addition, even when the addition of the subsidiary integration capacitor is delayed by the delay of the comparator Com or the control circuit 3, the integrator 1 can integrate the signal current input in the delay time by the main integration capacitor.

Therefore, the integrator 1 can integrate the signal current with high precision, as compared with the integrator according to the related art illustrated in FIG. 1. As a result, the AD converter according to this embodiment can execute AD conversion on the integral value of the signal current with high precision.

In addition, because the integrator 1 does not include an operational amplifier, an increase in power consumption due to the operational amplifier does not occur. Therefore, the integrator 1 can be configured with low power consumption, as compared with the integrator of FIG. 3. As a result, the AD converter according to this embodiment can be configured with low power consumption.

In addition, the AD converter according to this embodiment can generate the residual signal of the previously input signal current, on the basis of the voltage of the other main integration capacitor, while integrating the signal current by one main integration capacitor of the integrator 1. That is, the AD converter can execute the integration of the signal current and the generation of the residual signal at the same time. For this reason, the AD converter according to this embodiment can improve the throughput.

Second Embodiment

Figure 9:
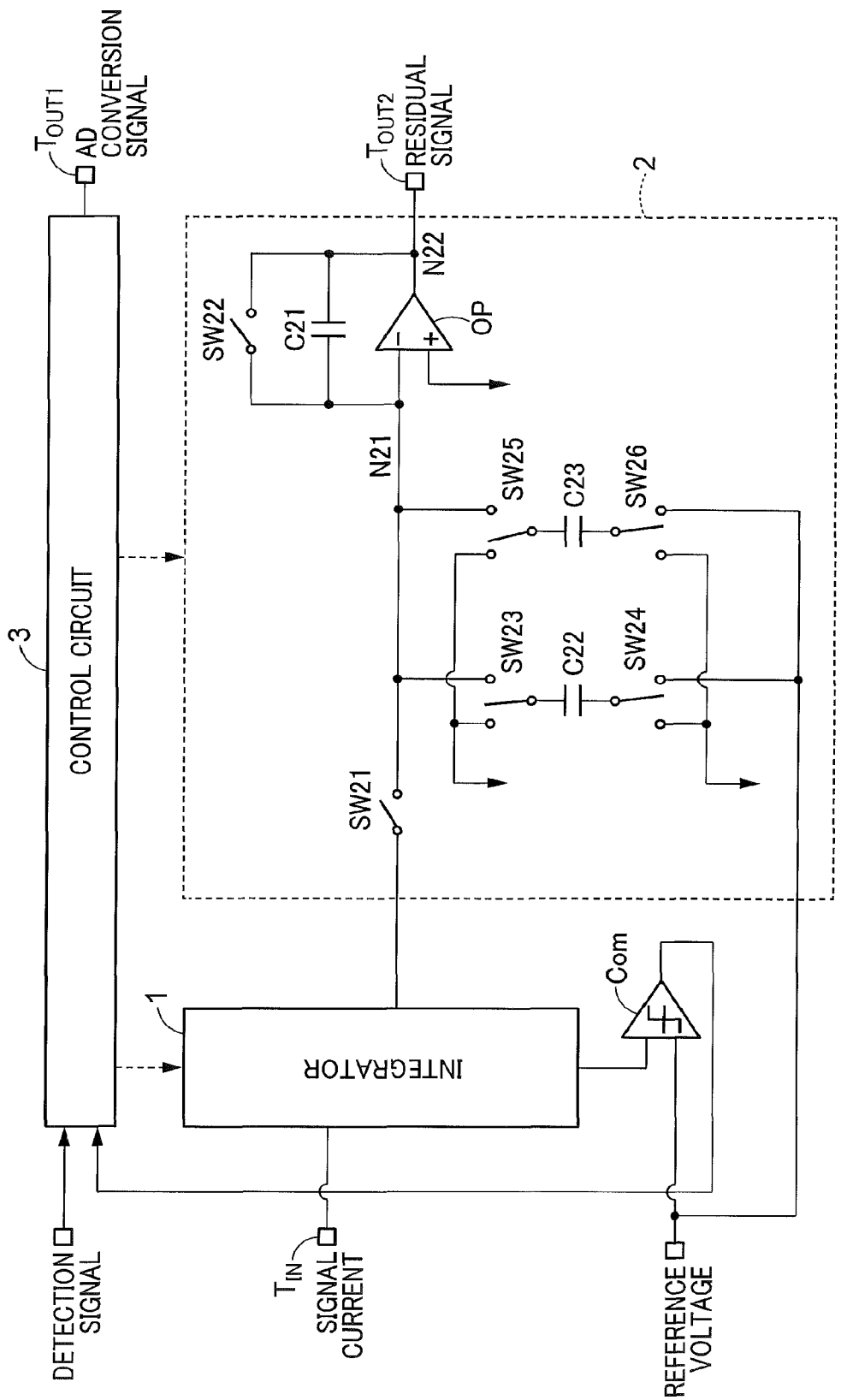
FIG. 9 is a diagram illustrating an example of an AD converter according to a second embodiment.

An AD converter according to a second embodiment will be described with reference to FIGS. 9 to 11. In this embodiment, a residual generation circuit 2 is described specifically. FIG. 9 is a diagram illustrating an example of the AD converter according to this embodiment. As illustrated in FIG. 9, the residual generation circuit 2 includes switches SW21 to SW26, a capacitor C21, and an operational amplifier OP. Opening and closing of the switches SW21 to SW26 are controlled by a control circuit 3. The other configuration is the same as the configuration of the first embodiment.

The switch SW21 has one end connected to an integrator 1 and the other end connected to a node N21. That is, one end of the switch SW21 is connected to the node N2. The node N2 corresponds to an input terminal of the residual generation circuit 2. The residual generation circuit 2 receives a voltage of a main integration capacitor of the integrator 1 after averaging from the node N2. In this embodiment, the node N21 is a connection point of the switches SW21 to SW23 and SW25, the capacitor C21, and the operational amplifier OP.

The operational amplifier OP has an inversion input terminal connected to the node N21, a non-inversion input terminal connected to a standard voltage line, and an output terminal connected to a node N22. In this embodiment, the node N22 is a connection point of the operational amplifier OP, the switch SW22, the capacitor C21, and an output terminal $T_{OUT2}$. The node N22 corresponds to the output terminal of the residual generation circuit 2. A voltage of the node N22 is output as a residual signal, from the output terminal $T_{OUT2}$.

The switch SW22 has one end connected to the node N21 and the other end connected to the node N22. If the switch SW22 is turned on, the capacitor C21 is reset.

The capacitor C21 has one end connected to the node N21 and the other end connected to the node N22. A capacity value of the capacitor C21 is C21. The capacitor C21 configures a negative feedback circuit to connect the inversion input terminal and the output terminal of the operational amplifier OP. A voltage (voltage of the node N22) of the capacitor C21 to which a charge of the main integration capacitor of the integrator 1 has been transferred by a virtual ground of the operational amplifier OP becomes a residual signal.

The switch SW23 has one end connected to one end of a capacitor C22 and the other end connected to the node N21 or the standard voltage line. The switch SW23 switches connection of one end of the capacitor C22 between the node N21 and the standard voltage line.

The switch SW24 has one end connected to the other end of the capacitor C22 and the other end connected to a reference voltage source or the standard voltage line. The switch SW24 switches connection of the other end of the capacitor C22 between the reference voltage source and the standard voltage line.

The capacitor C22 has one end connected to one end of the switch SW23 and the other end connected to one end of the switch SW24. A capacity value of the capacitor C22 is C22. The capacitor C22 is a subtraction capacitor to change the voltage of the main integration capacitor after the averaging to a voltage according to a residual, by extracting a predetermined charge from the main integration capacitor after the averaging.

If the other end of the switch SW23 is connected to the standard voltage line and the other end of the switch SW24 is connected to the reference voltage source, the capacitor C22 is connected between the reference voltage source and the standard voltage line. Therefore, a charge of C22×Vref is accumulated in the capacitor C22.

If the other end of the switch SW23 is connected to the node N21 and the other end of the switch SW24 is connected to the standard voltage line, the capacitor C22 is connected between the node N21 and the standard voltage line. At this time, if the switch SW22 is turned off, the charge accumulated in the capacitor C22 is transferred to the capacitor C21 by the virtual ground of the operational amplifier OP.

A polarity when the capacitor C22 is charged is reversed to a polarity when the capacitor C22 is connected to the node N21. Therefore, the capacitor C22 adds a charge of −C22×Vref to the capacitor C21. That is, the capacitor C22 subtracts the charge of C22×Vref from the capacitor C21.

The switch SW25 has one end connected to one end of a capacitor C23 and the other end connected to the node N21 or the standard voltage line. The switch SW25 switches connection of one end of the capacitor C23 between the node N21 and the standard voltage line.

The switch SW26 has one end connected to the other end of the capacitor C23 and the other end connected to the reference voltage source or the standard voltage line. The switch SW26 switches connection of the other end of the capacitor C23 between the reference voltage source and the standard voltage line.

The capacitor C23 has one end connected to one end of the switch SW25 and the other end connected to one end of the switch SW26. A capacity value of the capacitor C23 is C23. The capacitor C23 is a subtraction capacitor to change the voltage of the main integration capacitor after the averaging to a voltage according to a residual, by extracting a predetermined charge from the main integration capacitor after the averaging.

If the other end of the switch SW25 is connected to the standard voltage line and the other end of the switch SW26 is connected to the reference voltage source, the capacitor C23 is connected between the reference voltage source and the standard voltage line. Therefore, a charge of C23×Vref is accumulated in the capacitor C23.

If the other end of the switch SW25 is connected to the node N21 and the other end of the switch SW26 is connected to the standard voltage line, the capacitor C23 is connected between the node N21 and the standard voltage line. At this time, if the switch SW22 is turned off, the charge accumulated in the capacitor C23 is transferred to the capacitor C21 by the virtual ground of the operational amplifier OP.

A polarity when the capacitor C23 is charged is reversed to a polarity when the capacitor C23 is connected to the node N21. Therefore, the capacitor C23 adds a charge of −C23×Vref to the capacitor C21. That is, the capacitor C23 subtracts the charge of C23×Vref from the capacitor C21.

Next, an operation of the residual generation circuit 2 according to this embodiment will be described. FIG. 10 is a timing chart illustrating the operation of the residual generation circuit 2.

Figure 10:
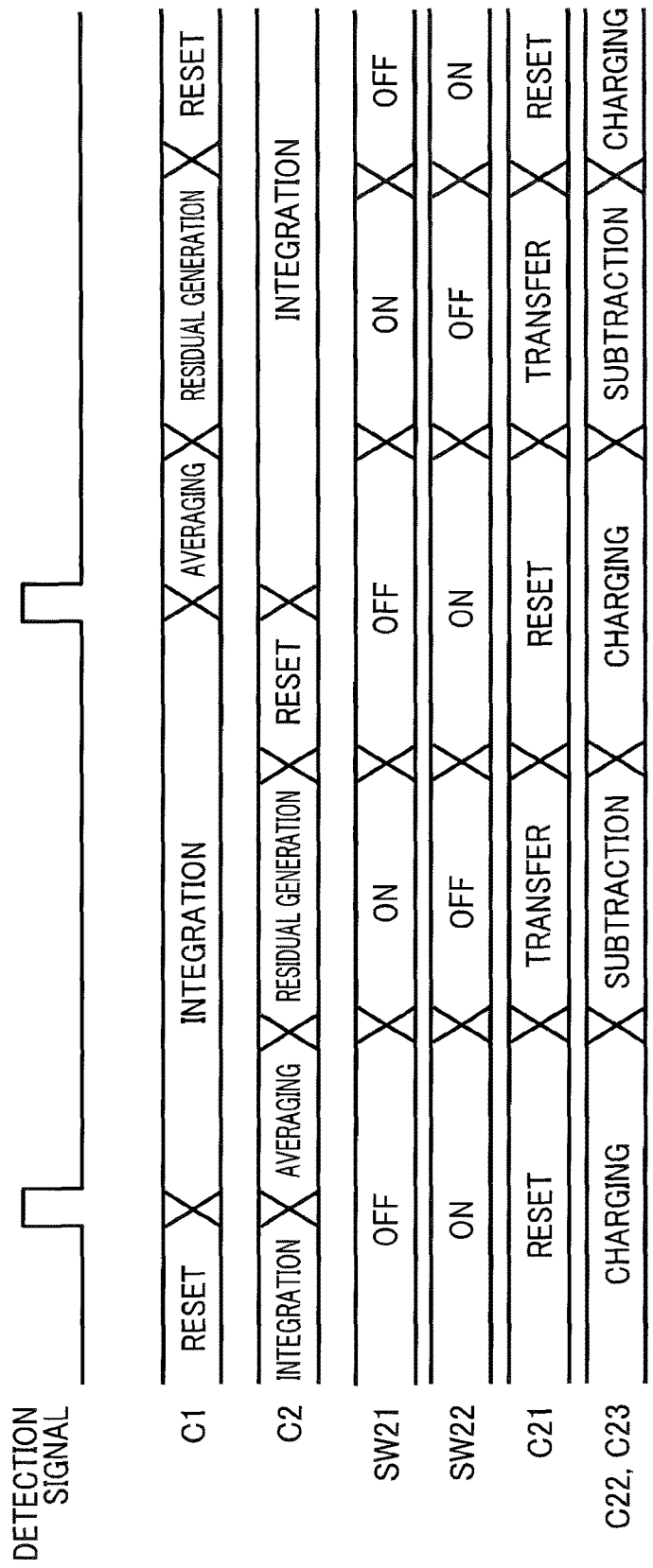
FIG. 10 is a timing chart illustrating an operation of a residual generation circuit of FIG. 8.

As illustrated in FIG. 10, if a signal current 1 is input to the AD converter, the capacitor C1 integrates the signal current 1. In parallel with the integration, a voltage of the capacitor C2 is averaged. After averaging of the voltage of the capacitor C2, the control circuit 3 causes the residual generation circuit 2 to start generation of a residual signal.

Specifically, the control circuit 3 turns on the switch SW21. As a result, the averaged voltage of the capacitor C2 is input to the residual generation circuit 2. In addition, the control circuit 3 turns off the switch SW22. As a result, a charge of the capacitor C2 after the averaging is transferred to the capacitor C21.

In addition, the control circuit 3 switches the switches SW23 to SW26 and connects a subtraction capacitor between the node N21 and the standard voltage line. As a result, a predetermined charge is extracted from the capacitor C21. An amount of the charge subtracted from the capacitor C21 is determined according to the number of times of the voltage of the capacitor C2 exceeding a reference voltage.

When the voltage of the capacitor C2 never exceeds the reference voltage, the control circuit 3 does not execute subtraction. That is, subtraction capacitors (capacitors C22 and C23) are not connected to the node N21.

When the voltage of the capacitor C2 exceeds the reference voltage once, the control circuit 3 connects the capacitor C22 to the node N21. As a result, a charge of C22×Vref is extracted from the capacitor C21.

When the voltage of the capacitor C2 exceeds the reference voltage two times, the control circuit 3 connects the capacitors C22 and C23 to the node N21. As a result, a charge of (C22+C23)×Vref is extracted from the capacitor C21.

As such, the predetermined charge is extracted from the capacitor C21 by the subtraction capacitor at the same time as when the charge of the capacitor C2 is transferred to the capacitor C21. In addition, the voltage of the capacitor C21 after the transfer and the subtraction end is output as a residual signal, from the output terminal $T_{OUT2}$.

After a predetermined time passes from when the generation of the residual signal starts, the control circuit 3 turns off the switch SW21 and turns on the switch SW22. As a result, the capacitor C21 is reset. In addition, the control circuit 3 switches the switches SW23 to SW26 and connects the subtraction capacitor between the reference voltage source and the standard voltage line. As a result, the subtraction capacitor is charged.

If a signal current 2 is input to the AD converter, the capacitor C2 integrates the signal current 2. In parallel with the integration, a voltage of the capacitor C1 is averaged. After averaging of the voltage of the capacitor C1, the control circuit 3 causes the residual generation circuit 2 to start generation of a residual signal.

Specifically, the control circuit 3 turns on the switch SW21. As a result, the averaged voltage of the capacitor C1 is input to the residual generation circuit 2. In addition, the control circuit 3 turns off the switch SW22. As a result, a charge of the capacitor C1 after the averaging is transferred to the capacitor C21.

In addition, the control circuit 3 switches the switches SW23 to SW26 and connects the subtraction capacitor between the node N21 and the standard voltage line. As a result, a predetermined charge is extracted from the capacitor C21. An amount of the charge subtracted from the capacitor C21 is determined according to the number of times of the voltage of the capacitor C1 exceeding the reference voltage.

When the voltage of the capacitor C1 never exceeds the reference voltage, the control circuit 3 does not execute subtraction. That is, the subtraction capacitors (capacitors C22 and C23) are not connected to the node N21.

When the voltage of the capacitor C1 exceeds the reference voltage once, the control circuit 3 connects the capacitor C22 to the node N121. As a result, a charge of C22×Vref is extracted from the capacitor C21.

When the voltage of the capacitor C1 exceeds the reference voltage two times, the control circuit 3 connects the capacitors C22 and C23 to the node N21. As a result, a charge of (C22+C23)×Vref is extracted from the capacitor C21.

As such, the predetermined charge is extracted from the capacitor C21 by the subtraction capacitor at the same time as when the charge of the capacitor C1 is transferred to the capacitor C21. In addition, the voltage of the capacitor C21 after the transfer and the subtraction end is output as a residual signal of the signal current 1, from the output terminal $T_{OUT2}$.

After a predetermined time passes from when generation of the residual signal starts, the control circuit 3 turns off the switch SW21 and turns on the switch SW22. As a result, the capacitor C21 is reset. In addition, the control circuit 3 switches the switches SW23 to SW26 and connects the subtraction capacitor between the reference voltage source and the standard voltage line. As a result, the subtraction capacitor is charged.

Here, a relation of a residual signal (voltage of the capacitor C21) and a total input charge amount will be described. FIG. 11 is a graph illustrating the relation of the residual signal (voltage of the capacitor C21) and the total input charge amount.

Figure 11:
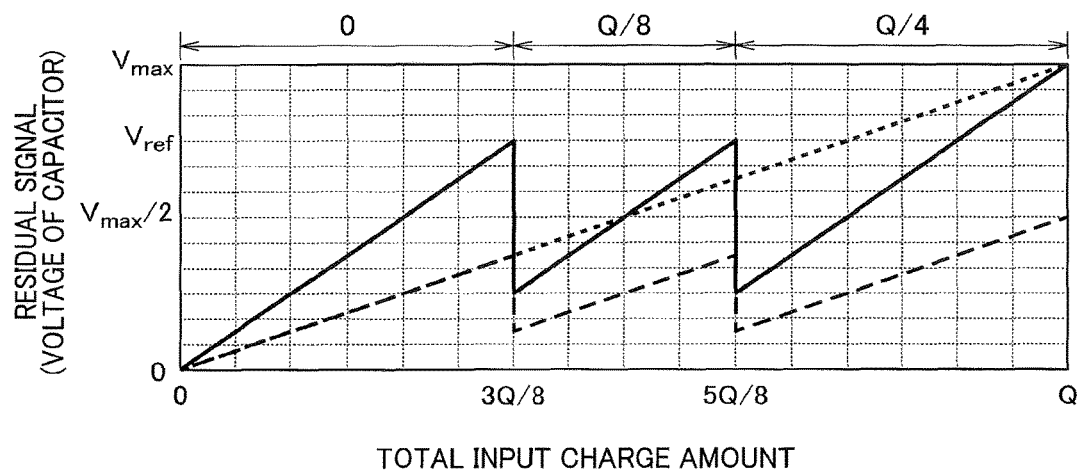
FIG. 11 is a graph illustrating a relation of a residual signal and a total input charge amount.

In FIG. 11, a dotted line shows a voltage of the main integration capacitor after the averaging, a broken line shows a voltage of the main integration capacitor from which the charge has been extracted, and a solid line shows a voltage (residual signal) of the capacitor C21 after the charge of the main integration capacitor is transferred. In FIG. 11, C21=4.5C(F) is satisfied. The other values are the same as the values in FIG. 5. Hereinafter, the case in which the main integration capacitor is the capacitor C1 will be described as an example.

The voltage (voltage of the capacitor C1 after the subtraction) shown by the broken line in FIG. 11 is shown conveniently to describe an amount of charge extracted from the capacitor C21. In actuality, because the charge of the capacitor C1 is transferred to the capacitor C21, the voltage shown by the broken line does not appear.

The voltage of the capacitor C1 is input to the residual generation circuit 2 after the averaging. At this time, the voltage of the capacitor C1 is proportional to the total input charge amount, as illustrated in FIG. 11.

In addition, the charge accumulated in the capacitor C1 is transferred to the capacitor C21 by the virtual ground of the operational amplifier OP. At this time, the residual generation circuit 2 extracts a predetermined charge from the capacitor C21 by the subtraction capacitor. An extracted charge amount is determined according to the number of times of the voltage of the capacitor C1 exceeding the reference voltage.

Specifically, when the voltage of the capacitor C1 never exceeds the reference voltage (the total input charge amount is equal to or smaller than 3Q/8), the extracted charge amount is 0. When the voltage of the capacitor C1 exceeds the reference voltage once (the total input charge amount is larger than 3Q/8 and is equal to or smaller than 5Q/8), the extracted charge amount is Q/8. When the voltage of the capacitor C1 exceeds the reference voltage two times (the total input charge amount is larger than 5Q/8), the extracted charge amount is Q/4.

As such, the charge is extracted, so that a residual signal proportional to the residual can be generated, as illustrated in FIG. 11. As known from FIG. 11, because C1×2=C21 is satisfied, the residual signal becomes a voltage 2 times as large as the voltage of the capacitor C1 after the subtraction.

In this embodiment, C22 and C23 are set such that the subtraction is enabled. In an example of FIG. 11, C22=C23=3C may be set. As a result, the charge amount subtracted by the capacitors C22 and C23 becomes 3C×Vref=Q/8 and the subtraction can be realized.

As described above, the residual generation circuit 2 can generate the residual signal by transferring the charge accumulated in the main integration capacitor after the averaging to the capacitor C21 and extracting the predetermined charge from the capacitor C21.

In this embodiment, because the predetermined charge amount may be subtracted from the amount of charge accumulated in the main integration capacitor, the subtracted charge amount can be decreased as compared with the case in which the predetermined charge amount is subtracted from the total input charge amount. Therefore, the capacity value of the subtraction capacitor is decreased, so that a circuit area of the residual generation circuit 2 can be decreased.

Third Embodiment

Figure 12:
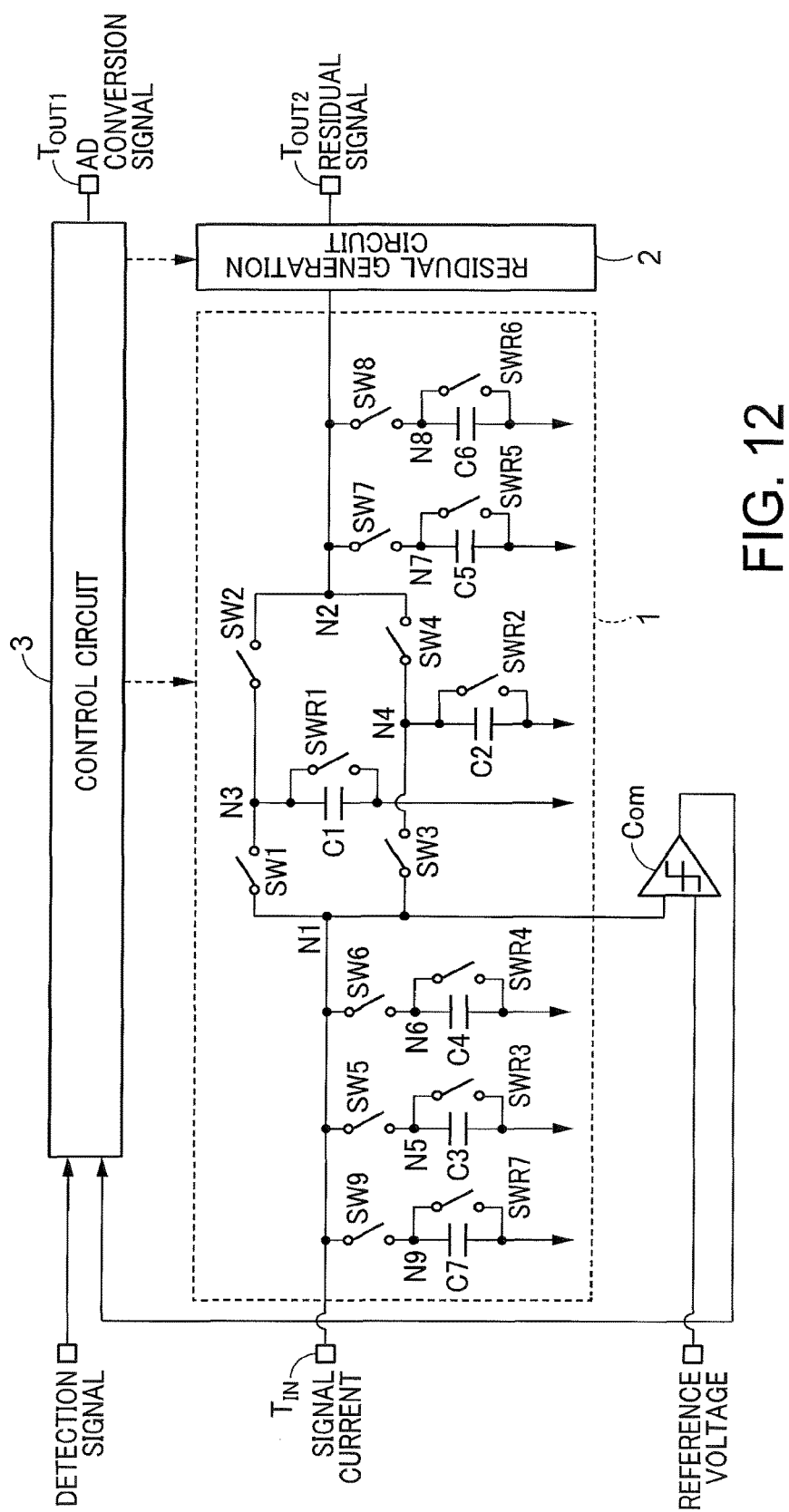
FIG. 12 is a diagram illustrating an example of an AD converter according to a third embodiment.
Figure 13:
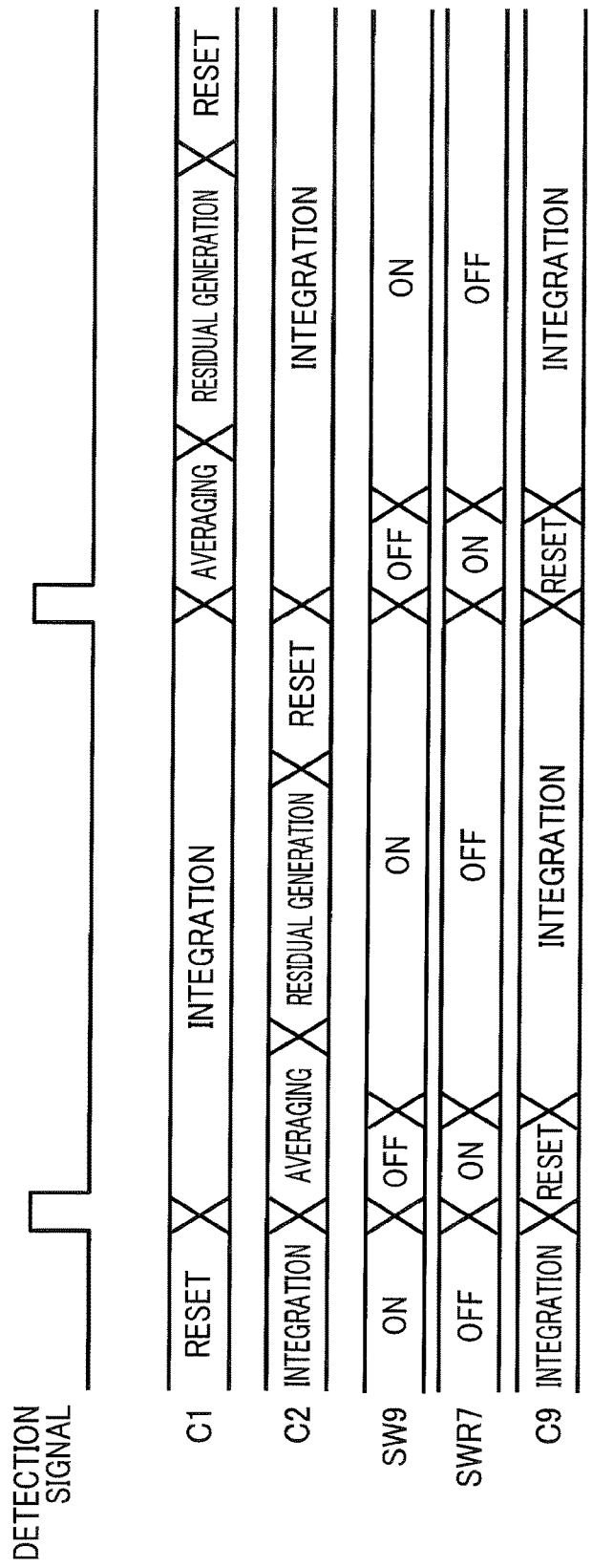
FIG. 13 is a timing chart illustrating an operation of the AD converter of FIG. 12.

An AD converter according to a third embodiment will be described with reference to FIGS. 12 and 13. FIG. 12 is a diagram illustrating an example of the AD converter according to this embodiment. As illustrated in FIG. 12, in this embodiment, an integrator 1 includes a switch SW9, a reset switch SWR7, and a capacitor C7. The other configuration is the same as the configuration of the first embodiment.

The switch SW9 (ninth switch) has one end connected to a node N1 and the other end connected to a node N9. In this embodiment, the node N9 is a connection point of the switch SW9, the capacitor C7, and the reset switch SWR7.

The capacitor C7 (third main integration capacitor) has one end connected to the node N9 and the other end connected to a standard voltage line. A capacity value of the capacitor C7 is C7. The capacitor C7 is a main integration capacitor to integrate odd-number-th and even-number-th signal currents input to the integrator 1. The capacitor C7 integrates the odd-number-th input signal current with a capacitor C1 and integrates the even-number-th input signal current with a capacitor C2.

However, the capacitor C7 starts integration of a signal current with a predetermined delay time as compared with the capacitors C1 and C2. This is because the capacitor C7 needs to be reset, whenever a new signal current is input.

The predetermined delay time of the capacitor C7 corresponds to a reset period of the capacitor C7.

The reset switch SWR7 (seventh reset switch) has one end connected to the node N9 and the other end connected to the standard voltage line. If the reset switch SWR7 is turned on, the capacitor C7 is reset.

Next, an operation of the AD converter according to this embodiment will be described with reference to FIG. 13. FIG. 13 is a timing chart illustrating an integration operation of the integrator 1. In FIG. 13, an operation of a subsidiary integration capacitor is omitted.

In this embodiment, if a signal current 1 is input to the AD converter and the capacitor C1 starts integration of the signal current 1, a control circuit 3 turns off the switch SW9 and turns on the reset switch SWR7. As a result, a capacitor C9 is reset. At this time, the switch SW9 is preferably turned off at a point of time earlier than a point of time when the reset switch SWR7 is turned on.

After a predetermined time passes from the start of the integration of the signal current 1, the control circuit 3 turns on the switch SW9 and turns off the reset switch SWR7. At this time, the reset switch SWR7 is preferably turned off at a point of time earlier than a point of time when the switch SW9 is turned on.

If the switch SW9 is turned on, a charge accumulated in the capacitor C1 is distributed to the capacitors C1 and C7 and a total capacity value of integration capacitors of the integrator 1 becomes C1+C7. Then, the signal current 1 is integrated by the capacitors C1 and C7, until a voltage of the capacitor C1 exceeds a reference voltage.

The following integration operation is the same as the integration operation of the first embodiment. The integrator 1 integrates the signal current 1 while adding a subsidiary integration capacitor, whenever the voltage of the capacitor C1 exceeds the reference voltage.

Then, if a signal current 2 is input to the AD converter and the capacitor C2 starts integration of the signal current 2, the control circuit 3 turns off the switch SW9 and turns on the reset switch SWR7. As a result, the capacitor C9 is reset. At this time, the switch SW9 is preferably turned off at a point of time earlier than a point of time when the reset switch SWR7 is turned on.

After a predetermined time passes from the start of the integration of the signal current 2, the control circuit 3 turns on the switch SW9 and turns off the reset switch SWR7. At this time, the reset switch SWR7 is preferably turned off at a point of time earlier than a point of time when the switch SW9 is turned on.

If the switch SW9 is turned on, a charge accumulated in the capacitor C2 is distributed to the capacitors C2 and C7 and a total capacity value of integration capacitors of the integrator 1 becomes C2+C7. Then, the signal current 2 is integrated by the capacitors C2 and C7, until a voltage of the capacitor C2 exceeds the reference voltage.

The following integration operation is the same as the integration operation of the first embodiment. The integrator 1 integrates the signal current 2 while adding a subsidiary integration capacitor, whenever the voltage of the capacitor C2 exceeds the reference voltage.

As described above, in this embodiment, the signal current is integrated by the capacitor C1 or C2 and the capacitor C7, until a voltage of a main integration capacitor exceeds the reference voltage first. At this time, a total capacity value of the integration capacitors of the integrator 1 becomes C1+C7 or C2+C7. The total capacity value corresponds to C1 or C2 in the first embodiment.

This corresponds to that the capacitors C1 and C2 in the first embodiment are configured by the capacitors C1 and C2 and the capacitor C7. By this configuration, capacity values of the capacitors C1 and C2 can be decreased as compared with the first embodiment. If the capacity values of the capacitors C1 and C2 decrease, a capacity value of an averaging capacitor can be decreased. Therefore, a circuit area of the integrator 1 can be decreased.

For example, in this embodiment, when C7=6C and C1=C2=3C are set, C5=2.4C and C6=0.6C may be set. At this time, C1+C2+C5+C6+C7=18C is satisfied. Meanwhile, in the first embodiment, because C1+C2+C5+C6=27C is satisfied, a capacity value decreases to ⅔.

In addition, if the capacity values of the capacitors C1 and C2 decrease, an amount of charge extracted from the capacitors C1 and C2 can be decreased by a subtraction capacitor of the residual generation circuit 2. Therefore, the capacity value of the subtraction capacitor of the residual generation circuit 2 is decreased, so that a circuit area of the residual generation circuit 2 can be decreased.

For example, similar to the above case, when C7=C6 and C1=C2=3C are set, an amount of charge subtracted by the subtraction capacitor may be set to −Q/24. For this reason, the capacity value of the subtraction capacitor becomes C. Meanwhile, in the second embodiment, because the capacity value is 3C, the capacity value decreases to ⅓.

Fourth Embodiment

Figure 14:
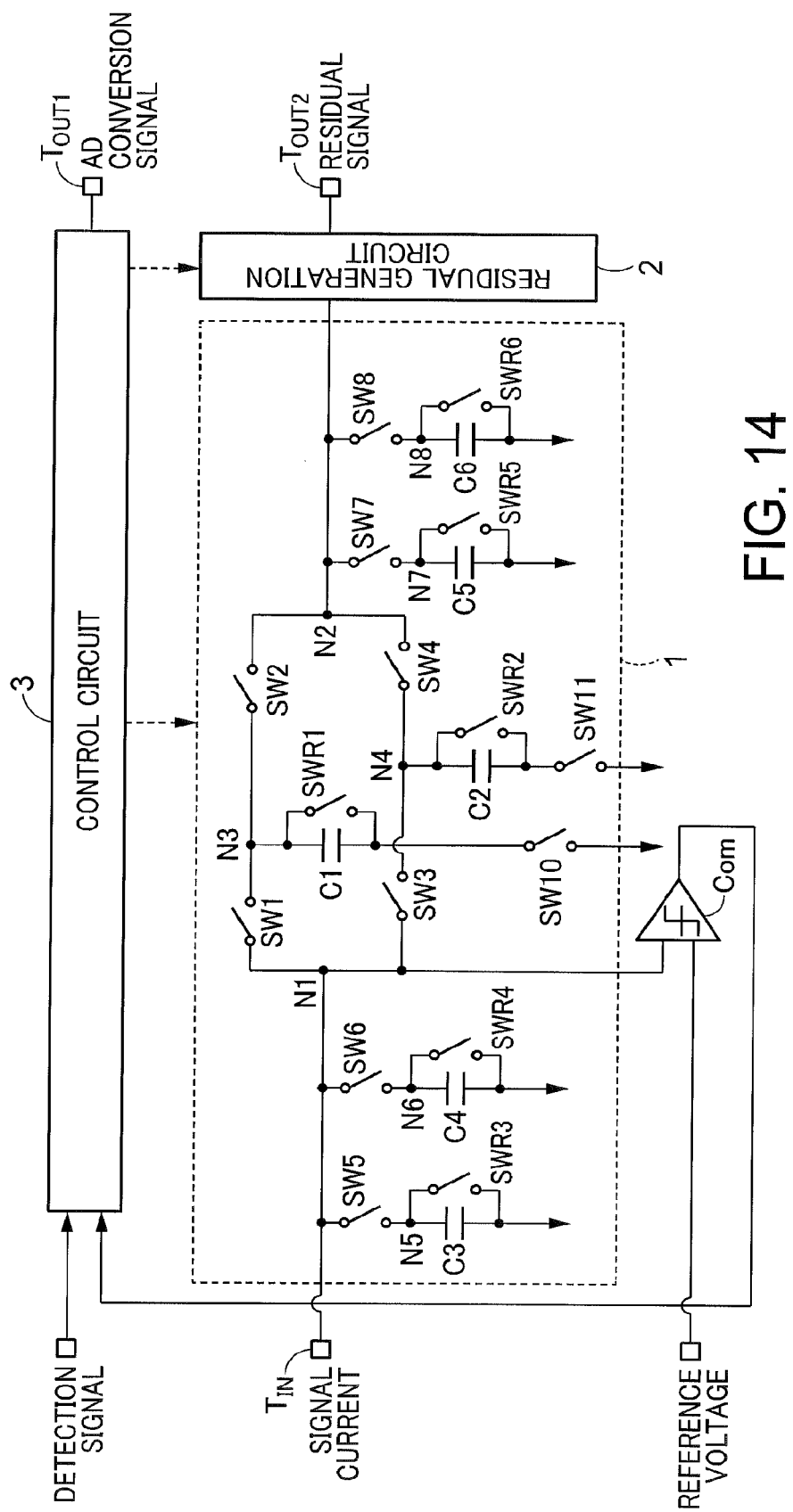
FIG. 14 is a diagram illustrating an example of an AD converter according to a fourth embodiment.

An AD converter according to a fourth embodiment will be described with reference to FIGS. 14 and 15. FIG. 14 is a diagram illustrating an example of the AD converter according to this embodiment. As illustrated in FIG. 14, in this embodiment, an integrator 1 includes switches SW10 and SW11. Opening and closing of the switches SW10 and SW11 are controlled by a control circuit 3. The other configuration is the same as the configuration of the first embodiment.

The switch SW10 (tenth switch) has one end connected to the other end of a capacitor C1 and the other end connected to a standard voltage line. That is, the switch SW10 is connected between the capacitor C1 and the standard voltage line.

The switch SW11 (eleventh switch) has one end connected to the other end of a capacitor C2 and the other end connected to the standard voltage line. That is, the switch SW11 is connected between the capacitor C2 and the standard voltage line.

Figure 15:
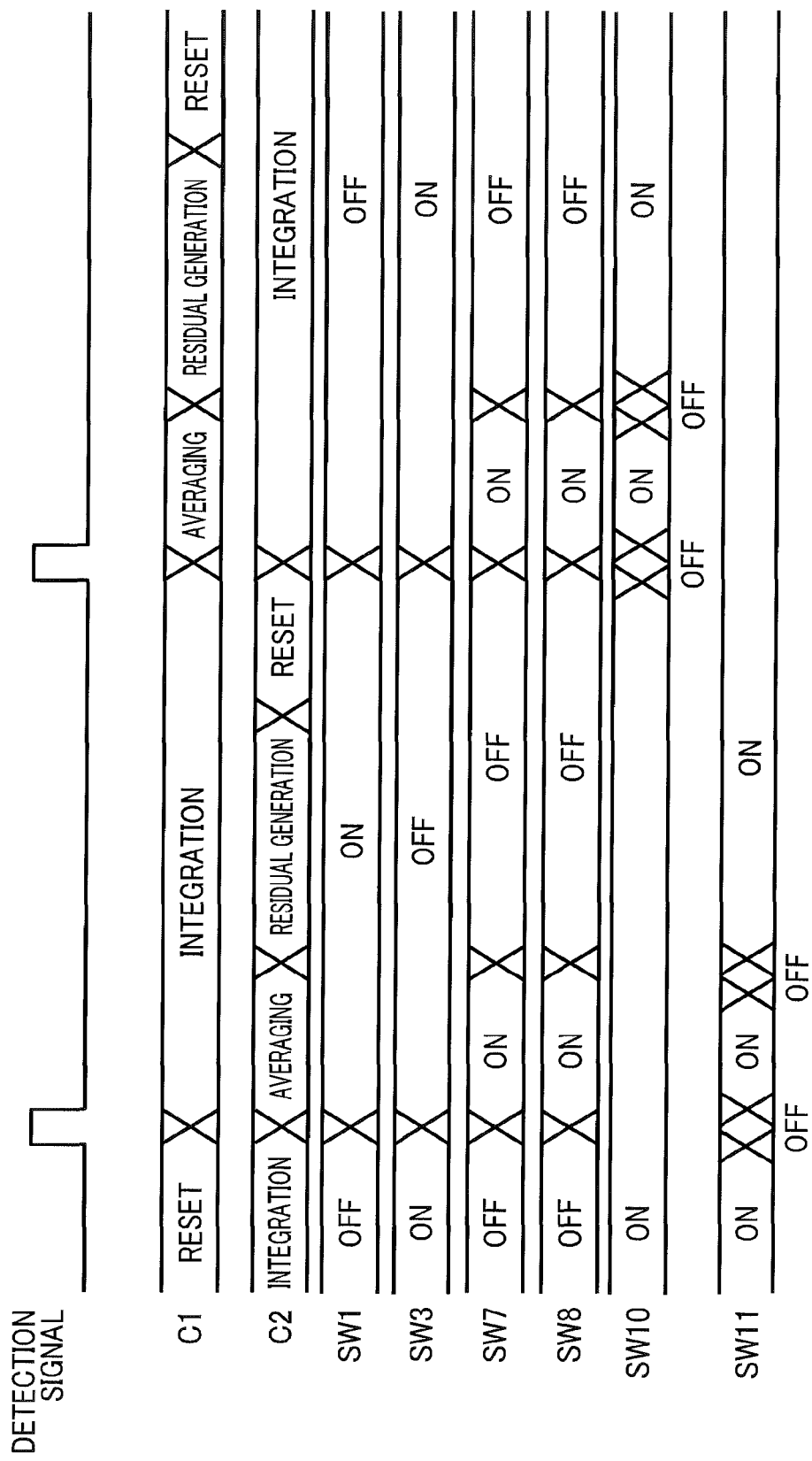
FIG. 15 is a timing chart illustrating an operation of the AD converter of FIG. 14.

FIG. 15 is a timing chart illustrating an operation of the integrator 1.

As illustrated in FIG. 15, the switch SW10 is turned off at start and end timing of averaging of a voltage of the capacitor C1. Specifically, the switch SW10 is turned off immediately before a switch SW1 is turned off and is turned on immediately after the switch SW1 is turned off. In addition, the switch SW10 is turned off immediately before switches SW7 and SW8 are turned off and is turned on immediately after the switches SW7 and SW8 are turned off, in a period in which the switch SW1 is turned off.

Meanwhile, the switch SW11 is turned off at start and end timing of averaging of a voltage of the capacitor C2. Specifically, the switch SW11 is turned off immediately before a switch SW2 is turned off and is turned on immediately after the switch SW2 is turned off. In addition, the switch SW11 is turned off immediately before the switches SW7 and SW8 are turned off and is turned on immediately after the switches SW7 and SW8 are turned off, in a period in which the switch SW2 is turned off.

In the case in which the switch configuring the integrator 1 is configured by a MOS transistor, charge injection occurs when the switch is turned off and a charge flows out from both ends of the switch. If the charge by the charge injection flows to a main integration capacitor when a residual signal is generated on the basis of a voltage of the main integration capacitor, an error may occur in the residual signal.

In this embodiment, the switch SW10 is turned off as described above, so that the charge can be suppressed from flowing from the switches SW1, SW7, and SW8 to the capacitor C1. In addition, the switch SW11 is turned off as described above, so that the charge can be suppressed from flowing from the switches SW2, SW7, and SW8 to the capacitor C2.

For this reason, according to this embodiment, the error of the residual signal is suppressed, so that AD conversion precision of an integral value of a signal current can be improved.

Fifth Embodiment

Figure 16:
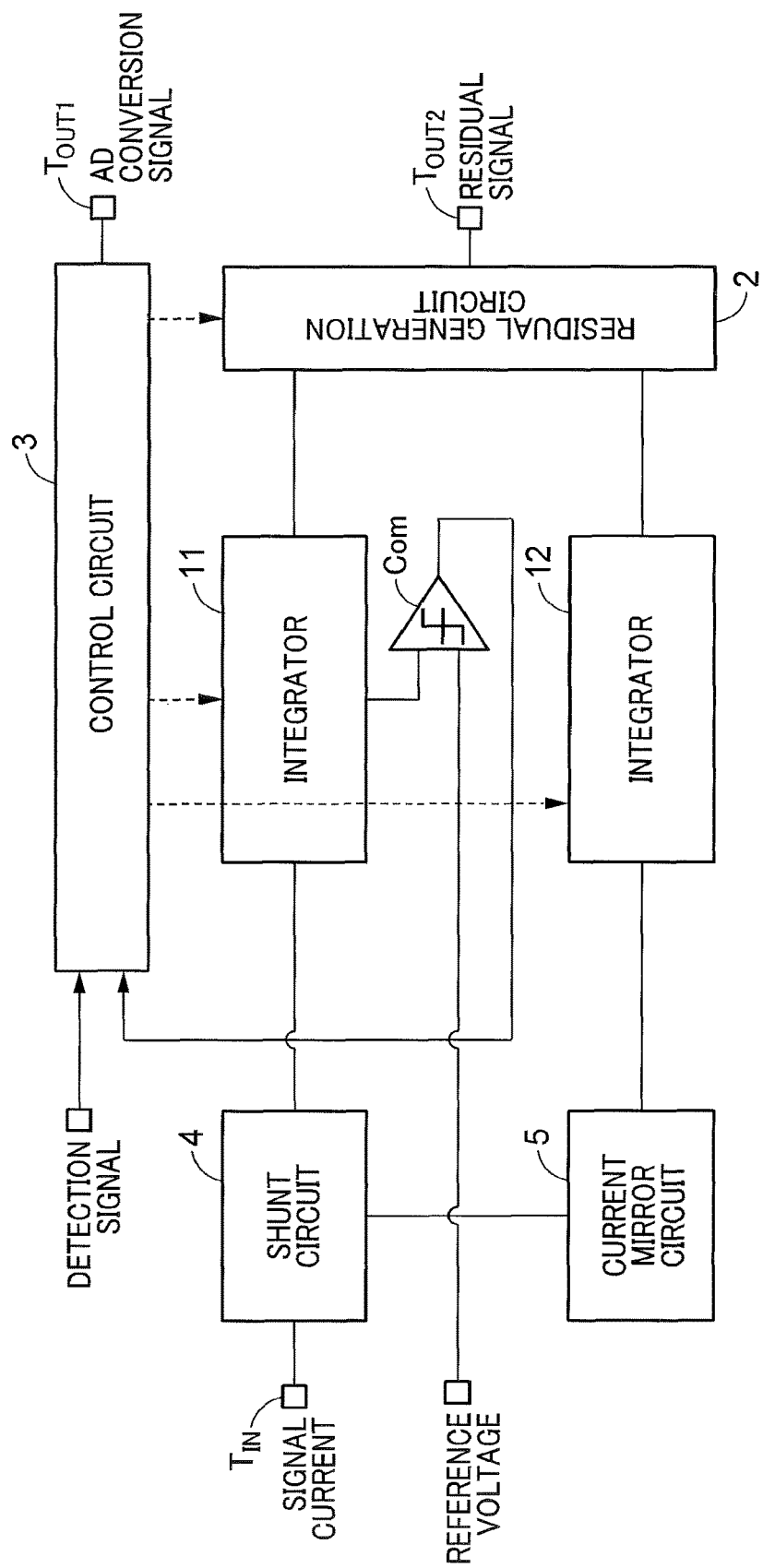
FIG. 16 is a diagram illustrating an example of an AD converter according to a fifth embodiment.

An AD converter according to a fifth embodiment will be described with reference to FIG. 16. The AD converter according to this embodiment is obtained by changing the configuration of the AD converter according to any embodiment described above to a differential configuration. FIG. 16 is a diagram illustrating the AD converter according to this embodiment. As illustrated in FIG. 16, the AD converter according to this embodiment includes integrators 11 and 12, a comparator Com, a residual generation circuit 2, a control circuit 3, a shunt circuit 4, and a current mirror circuit 5.

The configurations of the integrators 11 and 12, the comparator Com, the residual generation circuit 2, and the control circuit 3 are the same as the configurations of the integrator 1, the comparator Com, the residual generation circuit 2, and the control circuit 3 in any embodiment described above. However, in this embodiment, a standard voltage of the integrators 11 and 12 are preferably Vmax/2, not a ground voltage.

The shunt circuit 4 is connected to an input terminal $T_{IN}$ and receives a signal current. The shunt circuit 4 shunts the received signal current, inputs a part to the integrator 11, and inputs the other part to the current mirror circuit 5.

The current mirror circuit 5 receives the signal current shunted by the shunt circuit 4, returns the received signal current, and inputs the signal current to the integrator 12. As a result, the signal current shunted by the shunt circuit 4 is inverted and is input to the integrator 12.

For this reason, in this embodiment, a signal current having the magnitude of ½ of the signal current in the embodiments described above is input to the integrator 11. In addition, the signal current having the magnitude of ½ of the signal current in the embodiments described above is inverted and is input to the integrator 12.

According to this embodiment, the AD converter is formed to have the differential configuration, so that an in-phase noise superimposed on the signal current is cancelled. For this reason, the noise of the signal current can be reduced. Therefore, AD conversion precision of the signal current can be improved.

Sixth Embodiment

Figure 17:
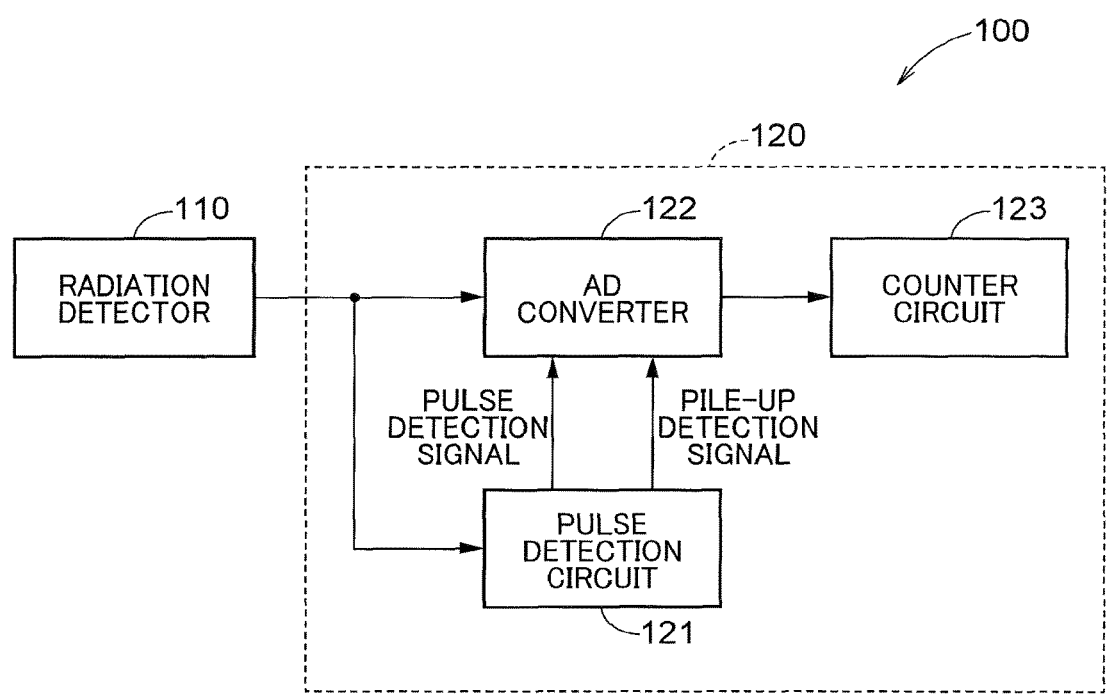
FIG. 17 is a diagram illustrating an example of a radiation detection device according to a sixth embodiment.

A radiation detection device 100 according to a sixth embodiment will be described with reference to FIG. 17.

The radiation detection device 100 according to this embodiment includes the AD converter according to any embodiment described above. FIG. 17 is a diagram illustrating the radiation detection device 100 according to this embodiment. As illustrated in FIG. 17, the radiation detection device 100 includes a radiation detector 110 and a radiation detection circuit 120.

The radiation detector 110 outputs a signal according to incident radiation. Generally, a signal output by the radiation detector 110 becomes a pulse. The radiation detector 110 is a scintillation detector including a scintillator and a photomultiplier tube, for example. However, the radiation detector 110 is not limited thereto. For example, the radiation detector 110 may be a semiconductor detector or a Geiger-Muller tube (GM tube). The output signal of the radiation detector 110 is input to the radiation detection circuit 120.

The radiation detection circuit 120 is a signal processing circuit that executes signal processing on the output signal of the radiation detector 110. The radiation detection circuit 120 detects and discriminates the radiation, on the basis of the output signal of the radiation detector 110. The radiation detection circuit 120 may be integrated with the radiation detector 110 and may be formed as an integrated circuit (IC) that can be connected to the radiation detector 110. As illustrated in FIG. 17, the radiation detection circuit 120 includes a pulse detection circuit 121, an AD converter 122, and a counter circuit 123.

The pulse detection circuit 121 receives the output signal of the radiation detector 110 and detects a pulse and pile-up. The pile-up means superimposition of pulses. The pulse detection circuit 121 detects the pulse, so that the radiation incident on the radiation detector 110 can be detected. A pulse detection signal and a pile-up detection signal output by the pulse detection circuit 121 are input to the AD converter 122.

The AD converter 122 is the AD converter according to any embodiment described above. The AD converter 122 receives the output signal of the radiation detector 110 and executes AD conversion on an integral value thereof. The AD conversion by the AD converter 122 is controlled by the pulse detection signal and the pile-up detection signal.

In this embodiment, the pulse output by the radiation detector 110 corresponds to a signal current. The pulse detection signal output by the pulse detection circuit 121 corresponds to a detection signal. Both the pulse detection signal and the pile-up detection signal are input to the control circuit 3.

If the AD converter 122 receives the pulse detection signal, the AD converter 122 starts the AD conversion. The pulse detection signal corresponds to the detection signal. For example, the AD converter 122 integrates the output signal (that is, the pulse detected by the pulse detection circuit) of the radiation detector 110, executes the AD conversion on an integral value, and outputs an AD conversion value. As a result, a digital signal showing energy of the radiation incident on the radiation detector 110 is output.

The integration by the AD converter 122 may end after a predetermined time passes from the start of the integration, may end when a level of the output signal of the radiation detector 110 becomes equal to or less than a predetermined value, and may end when an end signal is input from the pulse detection circuit 121.

If the AD converter 122 receives the pile-up detection signal, the AD converter 122 resets the AD conversion during execution. For this reason, if the pile-up is detected even when the pulse is detected by the pulse detection circuit 121, the AD conversion is not executed.

The counter circuit 123 counts each AD conversion value output by the AD converter 122. Because an energy spectrum of the radiation is obtained by a count value for each AD conversion value counted by the counter circuit 123, the radiation can be discriminated.

As described above, the radiation detection circuit 120 according to this embodiment includes the AD converter 122 according to the first embodiment. Therefore, the radiation detection circuit 120 can discriminate the radiation with high precision. In addition, the radiation detection circuit 120 can be configured with low power consumption. In addition, the radiation detection circuit 120 can be operated at a high speed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An integrator comprising:
   a first node that receives a signal current;
   a second node that outputs a voltage;
   a first switch that has one end connected to the first node and the other end connected to a third node;
   a second switch that has one end connected to the third node and the other end connected to the second node;
   a first main integration capacitor that has one end connected to the third node and the other end connected to a standard voltage line;
   a third switch that has one end connected to the first node and the other end connected to a fourth node;
   a fourth switch that has one end connected to the fourth node and the other end connected to the second node;
   a second main integration capacitor that has one end connected to the fourth node and the other end connected to the standard voltage line;
   a fifth switch that has one end connected to the first node and the other end connected to a fifth node; and
   a first subsidiary integration capacitor that has one end connected to the fifth node and the other end connected to the standard voltage line.

2. The integrator according to claim 1, further comprising:
   a sixth switch that has one end connected to the first node and the other end connected to a sixth node; and
   a second subsidiary integration capacitor that has one end connected to the sixth node and the other end connected to the standard voltage line.

3. The integrator according to claim 2, further comprising:
   a fourth reset switch that has one end connected to the sixth node and the other end connected to the standard voltage line.

4. The integrator according to claim 1, further comprising:
   a seventh switch that has one end connected to the second node and the other end connected to a seventh node; and
   a first averaging capacitor that has one end connected to the seventh node and the other end connected to the standard voltage line.

5. The integrator according to claim 4, further comprising:
   a fifth reset switch that has one end connected to the seventh node and the other end connected to the standard voltage line.

6. The integrator according to claim 1, further comprising:
   an eighth switch that has one end connected to the second node and the other end connected to an eighth node; and
   a second averaging capacitor that has one end connected to the eighth node and the other end connected to the standard voltage line.

7. The integrator according to claim 6, further comprising:
   a sixth reset switch that has one end connected to the eighth node and the other end connected to the standard voltage line.

8. The integrator according to claim 1, further comprising:
   a first reset switch that has one end connected to the third node and the other end connected to the standard voltage line;
   a second reset switch that has one end connected to the fourth node and the other end connected to the standard voltage line; and
   a third reset switch that has one end connected to the fifth node and the other end connected to the standard voltage line.

9. The integrator according to claim 1, further comprising:
   a ninth switch that has one end connected to the first node and the other end connected to a ninth node;
   a third main integration capacitor that has one end connected to the ninth node and the other end connected to the standard voltage line; and
   a seventh reset switch that has one end connected to the ninth node and the other end connected to the standard voltage line.

10. The integrator according to claim 1, further comprising:
    a tenth switch that is connected between the other end of the first main integration capacitor and the standard voltage line; and
    an eleventh switch that is connected between the other end of the second main integration capacitor and the standard voltage line.

11. An AD converter comprising:
    the integrator according to claim 1;
    a comparator that compares a voltage of the first node of the integrator and a reference voltage and outputs a comparison result;
    a residual generation circuit that generates a residual signal, on the basis of a voltage of the second node of the integrator; and
    a control circuit that controls the integrator and the residual generation circuit, on the basis of the comparison result.

12. The AD converter according to claim 11,
    wherein, when the odd-number-th signal current is input, the control circuit causes the residual generation circuit to generate the residual signal, on the basis of the voltage of the second main integration capacitor, and when the even-number-th signal current is input, the control circuit causes the residual generation circuit to generate the residual signal, on the basis of the voltage of the first main integration capacitor.

13. The AD converter according to claim 11,
    wherein the control circuit outputs an AD conversion signal obtained by executing AD conversion on an integral value of the signal current, on the basis of the comparison result.

14. The AD converter according to claim 11, further comprising:
- a shunt circuit that shunts the signal current; and
- a current mirror circuit that returns the signal current shunted by the shunt circuit.

15. A radiation detection device comprising:
- a radiation detector that detects radiation;
- a pulse detection circuit that detects a pulse output by the radiation detector; and
- the AD converter according to claim 11 that executes AD conversion on an integral value of the pulse output by the radiation detector.

16. The AD converter according to claim 11,
- wherein the control circuit integrates the signal current by the first main integration capacitor or the second main integration capacitor, until the voltage of the first node exceeds the reference voltage first, and integrates the signal current by the first main integration capacitor or the second main integration capacitor and the first subsidiary integration capacitor, when the voltage of the first node exceeds the reference voltage first.

17. The AD converter according to claim 11,
- wherein the control circuit integrates the signal current input odd-number-th by the first main integration capacitor and integrates the signal current input even-number-th by the second main integration capacitor.

* * * * *